(12) United States Patent
Choi et al.

(10) Patent No.: US 11,728,297 B2
(45) Date of Patent: Aug. 15, 2023

(54) SEMICONDUCTOR DEVICES, SEMICONDUCTOR PACKAGES, AND METHODS OF MANUFACTURING THE SEMICONDUCTOR DEVICES

(71) Applicant: Samsung Electronics Co., Ltd., Suwon-si (KR)

(72) Inventors: Ju-il Choi, Seongnam-si (KR); Kwang-jin Moon, Hwaseong-si (KR); Ju-bin Seo, Seongnam-si (KR); Dong-chan Lim, Suwon-si (KR); Atsushi Fujisaki, Seongnam-si (KR); Ho-jin Lee, Seoul (KR)

(73) Assignee: Samsung Electronics Co., Ltd.

( * ) Notice: Subject to any disclaimer, the term of this patent is extended or adjusted under 35 U.S.C. 154(b) by 156 days.

(21) Appl. No.: 17/325,384

(22) Filed: May 20, 2021

(65) Prior Publication Data
US 2021/0272918 A1    Sep. 2, 2021

Related U.S. Application Data

(63) Continuation of application No. 16/398,888, filed on Apr. 30, 2019, now Pat. No. 11,018,101, which is a (Continued)

(30) Foreign Application Priority Data

Jul. 24, 2017   (KR) .................. 10-2017-0093692

(51) Int. Cl.
*H01L 21/768* (2006.01)
*H01L 23/00* (2006.01)
(Continued)

(52) U.S. Cl.
CPC .......... *H01L 24/05* (2013.01); *H01L 23/3135* (2013.01); *H01L 23/3171* (2013.01); (Continued)

(58) Field of Classification Search
CPC ............... H01L 23/481; H01L 23/3135; H01L 23/3171; H01L 2224/03416–92125
See application file for complete search history.

(56) References Cited

U.S. PATENT DOCUMENTS

| 6,218,302 B1 | 4/2001 | Braeckelmann et al. |
| 6,452,270 B1 | 9/2002 | Huang |

(Continued)

FOREIGN PATENT DOCUMENTS

| CN | 1574324 A | 2/2005 |
| CN | 102088004 A | 6/2011 |

(Continued)

*Primary Examiner* — Hoa B Trinh
(74) *Attorney, Agent, or Firm* — Myers Bigel, P.A.

(57) ABSTRACT

A semiconductor device includes a conductive component on a substrate, a passivation layer on the substrate and including an opening that exposes at least a portion of the conductive component, and a pad structure in the opening and located on the passivation layer, the pad structure being electrically connected to the conductive component. The pad structure includes a lower conductive layer conformally extending on an inner sidewall of the opening, the lower conductive layer including a conductive barrier layer, a first seed layer, an etch stop layer, and a second seed layer that are sequentially stacked, a first pad layer on the lower conductive layer and at least partially filling the opening, and a second pad layer on the first pad layer and being in contact with a peripheral portion of the lower conductive layer located on the top surface of the passivation layer.

20 Claims, 26 Drawing Sheets

Related U.S. Application Data continuation of application No. 15/870,044, filed on Jan. 12, 2018, now Pat. No. 10,325,869.

(51) Int. Cl.
   | | |
   |---|---|
   | *H01L 23/31* | (2006.01) |
   | *H01L 23/48* | (2006.01) |
   | *H01L 25/065* | (2023.01) |
   | *H01L 25/18* | (2023.01) |

(52) U.S. Cl.
   CPC ............ *H01L 23/481* (2013.01); *H01L 24/03* (2013.01); *H01L 24/13* (2013.01); *H01L 24/16* (2013.01); *H01L 25/0657* (2013.01); H01L 23/3128 (2013.01); H01L 24/17 (2013.01); H01L 24/32 (2013.01); H01L 24/73 (2013.01); H01L 24/81 (2013.01); H01L 24/92 (2013.01); H01L 25/18 (2013.01); H01L 2224/0362 (2013.01); H01L 2224/03416 (2013.01); H01L 2224/03418 (2013.01); H01L 2224/03452 (2013.01); H01L 2224/03462 (2013.01); H01L 2224/03464 (2013.01); H01L 2224/03614 (2013.01); H01L 2224/03831 (2013.01); H01L 2224/03916 (2013.01); H01L 2224/0401 (2013.01); H01L 2224/0508 (2013.01); H01L 2224/05016 (2013.01); H01L 2224/05017 (2013.01); H01L 2224/05022 (2013.01); H01L 2224/05024 (2013.01); H01L 2224/05085 (2013.01); H01L 2224/05124 (2013.01); H01L 2224/05144 (2013.01); H01L 2224/05147 (2013.01); H01L 2224/05155 (2013.01); H01L 2224/05164 (2013.01); H01L 2224/05166 (2013.01); H01L 2224/05169 (2013.01); H01L 2224/05171 (2013.01); H01L 2224/05181 (2013.01); H01L 2224/05184 (2013.01); H01L 2224/05557 (2013.01); H01L 2224/05558 (2013.01); H01L 2224/05562 (2013.01); H01L 2224/05564 (2013.01); H01L 2224/05567 (2013.01); H01L 2224/05568 (2013.01); H01L 2224/05582 (2013.01); H01L 2224/05624 (2013.01); H01L 2224/05639 (2013.01); H01L 2224/05644 (2013.01); H01L 2224/05647 (2013.01); H01L 2224/05655 (2013.01); H01L 2224/05669 (2013.01); H01L 2224/05684 (2013.01); H01L 2224/06181 (2013.01); H01L 2224/1312 (2013.01); H01L 2224/13022 (2013.01); H01L 2224/13024 (2013.01); H01L 2224/13025 (2013.01); H01L 2224/13082 (2013.01); H01L 2224/13109 (2013.01); H01L 2224/13111 (2013.01); H01L 2224/13113 (2013.01); H01L 2224/13116 (2013.01); H01L 2224/13118 (2013.01); H01L 2224/13139 (2013.01); H01L 2224/13144 (2013.01); H01L 2224/13147 (2013.01); H01L 2224/13155 (2013.01); H01L 2224/13164 (2013.01); H01L 2224/13169 (2013.01); H01L 2224/16145 (2013.01); H01L 2224/16148 (2013.01); H01L 2224/16227 (2013.01); H01L 2224/17181 (2013.01); H01L 2224/32145 (2013.01); H01L 2224/32225 (2013.01); H01L 2224/73204 (2013.01); H01L 2224/8181 (2013.01); H01L 2224/81203 (2013.01); H01L 2224/81815 (2013.01); H01L 2224/92125 (2013.01); H01L 2225/06513 (2013.01); H01L 2225/06517 (2013.01); H01L 2225/06541 (2013.01); H01L 2225/06586 (2013.01); H01L 2924/04941 (2013.01); H01L 2924/04953 (2013.01); H01L 2924/15311 (2013.01)

(56) References Cited

U.S. PATENT DOCUMENTS

| | | | |
|---|---|---|---|
| 7,518,241 | B2 | 4/2009 | Tai et al. |
| 7,579,671 | B2 | 8/2009 | Takao |
| 7,863,741 | B2 | 1/2011 | Ozaki et al. |
| 8,154,129 | B2 | 4/2012 | Okada et al. |
| 8,592,995 | B2 | 11/2013 | Lin et al. |
| 8,658,528 | B2 | 2/2014 | Kuo et al. |
| 8,659,155 | B2 | 2/2014 | Cheng et al. |
| 8,847,387 | B2 | 9/2014 | Hsiao et al. |
| 9,018,758 | B2 | 4/2015 | Hwang et al. |
| 9,116,203 | B2 | 8/2015 | Wu et al. |
| 9,142,498 | B2 | 9/2015 | Noh et al. |
| 9,185,804 | B2 | 11/2015 | Isono |
| 9,450,061 | B2 | 9/2016 | Lin |
| 9,806,004 | B2 | 10/2017 | Lee et al. |
| 10,354,965 | B2 | 7/2019 | Bih et al. |
| 2008/0090407 | A1* | 4/2008 | Coolbaugh ............ H01L 24/03 257/E21.476 |
| 2010/0090318 | A1 | 4/2010 | Hsu et al. |
| 2010/0148360 | A1 | 6/2010 | Fang et al. |
| 2011/0101523 | A1 | 5/2011 | Hwang et al. |
| 2011/0101527 | A1 | 5/2011 | Cheng et al. |
| 2011/0260317 | A1 | 10/2011 | Lu et al. |
| 2014/0124928 | A1 | 5/2014 | Lin et al. |
| 2014/0339699 | A1 | 11/2014 | Arvin et al. |
| 2015/0001712 | A1* | 1/2015 | Daubenspeck ......... H01L 24/03 257/738 |
| 2015/0028461 | A1 | 1/2015 | Gatterbauer et al. |
| 2015/0145057 | A1 | 5/2015 | Fan et al. |
| 2016/0163663 | A1 | 6/2016 | Kim et al. |
| 2017/0154850 | A1* | 6/2017 | Kao .................. H01L 21/76898 |
| 2017/0271434 | A1 | 9/2017 | Chou et al. |
| 2018/0151527 | A1* | 5/2018 | Chang .................... H01L 24/11 |

FOREIGN PATENT DOCUMENTS

| | | |
|---|---|---|
| KR | 20070015761 A | 2/2007 |
| KR | 20090106913 A | 10/2009 |
| KR | 20120011768 A | 2/2012 |
| KR | 20160065631 A | 6/2016 |

* cited by examiner

SEMICONDUCTOR DEVICES, SEMICONDUCTOR PACKAGES, AND METHODS OF MANUFACTURING THE SEMICONDUCTOR DEVICES

CROSS-REFERENCE TO RELATED APPLICATION

This application is a continuation application of and claims priority from U.S. patent application Ser. No. 16/398,888, now U.S. Pat. No. 11,018,101, filed on Apr. 30, 2019, which is a continuation application of and claims priority from U.S. patent application Ser. No. 15/870,044, now U.S. Pat. No. 10,325,869, filed on Jan. 12, 2018, which claims the benefit of Korean Patent Application No. 10-2017-0093692, filed on Jul. 24, 2017, in the Korean Intellectual Property Office, the disclosures of which are hereby incorporated by reference in entirety.

BACKGROUND

The inventive concepts relate to semiconductor devices, semiconductor packages, and methods of manufacturing the semiconductor devices, and more particularly, to semiconductor devices including pad structures and methods of manufacturing semiconductor devices.

In accordance with the rapid development of the electronics industry and user demand, electronic devices are being manufactured to be smaller in size and weight, and semiconductor packages used for the electronic devices have needed not only to be small and lightweight, but also to have high performance and high capacity. With the growing tendency toward smaller and lighter semiconductor packages, research into semiconductor packages including a plurality of stacked semiconductor chips is being performed in order to obtain semiconductor packages of high performance and capacity. However, complications may arise in electrical interconnection of such stacked semiconductor chips, for instance, due to step differences in interconnecting pad structures. In particular examples, trapping of non-conductive materials and/or forming of intermetallic compounds (IMC) may occur due to such step differences, which may degrade reliability.

SUMMARY

The inventive concepts provide a semiconductor device including a pad structure having high joint reliability, a semiconductor package, and methods of manufacturing the semiconductor device and the semiconductor package.

According to some embodiments of the inventive concepts, a semiconductor device includes a conductive component on a substrate, a passivation layer located over the substrate and including an opening, wherein the opening exposes at least a portion of the conductive component, and a pad structure filling the opening and located on the passivation layer, the pad structure electrically connected to the conductive component. The pad structure includes a lower conductive layer conformally formed on an inner wall of the opening and on a top surface of the passivation layer around the opening, the lower conductive layer including a conductive barrier layer, a first seed layer, an etch stop layer, and a second seed layer that are sequentially stacked, a first pad layer on the lower conductive layer, the first pad layer at least partially filling the opening, and a second pad layer on the first pad layer, the second pad layer in contact with a peripheral portion of the lower conductive layer located on the top surface of the passivation layer.

According to some embodiments of the inventive concepts, a semiconductor package includes a first semiconductor chip, and a second semiconductor chip connected to the first semiconductor chip. The second semiconductor chip includes a conductive component on a substrate, a passivation layer over the substrate and including an opening, the opening exposing at least a portion of the conductive component, and a pad structure on the passivation layer and filling the opening, the pad structure electrically connected to the conductive component. The pad structure includes a lower conductive layer conformally formed on an inner wall of the opening and on a top surface of the passivation layer around the opening, the lower conductive layer including a conductive barrier layer, a first seed layer, an etch stop layer, and a second seed layer that are sequentially stacked, a first pad layer on the lower conductive layer, the first pad layer at least partially filling the opening, and a second pad layer on the first pad layer, the second pad layer in contact with a peripheral portion of the lower conductive layer located on the top surface of the passivation layer.

According to some embodiments of the inventive concepts, a method of manufacturing a semiconductor device includes forming, on a substrate, a passivation layer including an opening, the opening exposing at least a portion of a conductive component; forming a lower conductive layer on an inner wall of the opening and a top surface of the passivation layer by sequentially forming a conductive barrier layer, a first seed layer, an etch stop layer, and a second seed layer; forming a mold layer on the lower conductive layer, the mold layer including a pad space communicated with the opening; forming, on the lower conductive layer, a first pad layer filling the opening; and forming, on the first pad layer, a second pad layer filling a remaining portion of the pad space.

According to some embodiments of the inventive concepts, a semiconductor device includes a conductive component on a substrate, a passivation layer on the substrate and having an opening therein that exposes a portion of the conductive component, and a conductive pad structure on the passivation layer and in the opening. The conductive pad structure includes a lower conductive layer on a sidewall of the opening and on a surface of the passivation layer outside the opening. The lower conductive layer includes a first seed layer, an etch stop layer, and a second seed layer that are sequentially stacked. The conductive pad structure further includes a first pad layer directly on the second seed layer in the opening, and a second pad layer directly on the first seed layer outside the opening. The first pad layer is separated from the first seed layer by portions of the second seed layer, the etch stop layer, and/or the second pad layer, and a top surface of the second pad layer is substantially planar.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EMBODIMENTS

The inventive concepts will now be described more fully with reference to the accompanying drawings, in which embodiments of the inventive concepts are shown.

Figure 1:
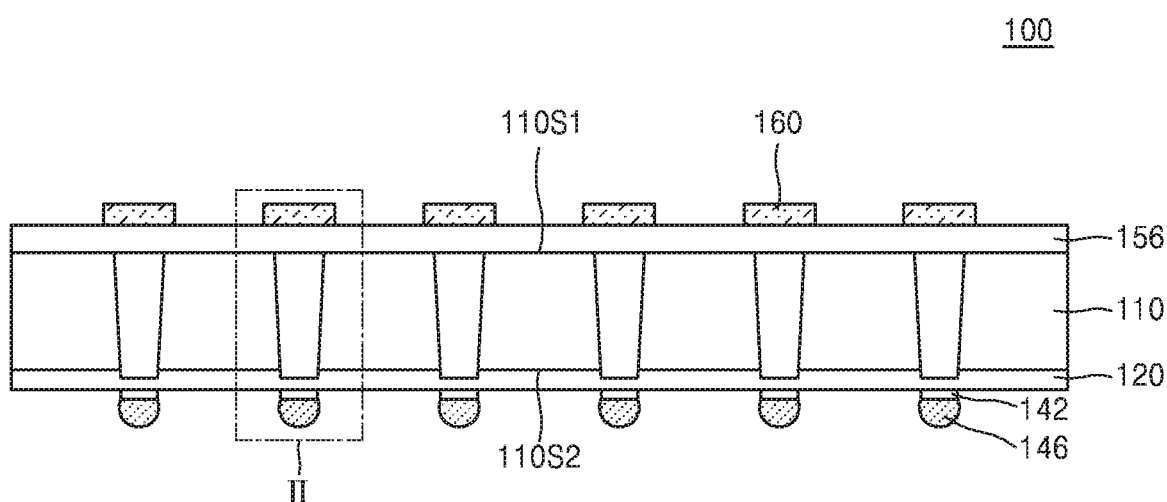
FIG. 1 is a cross-sectional view of a semiconductor device according to some embodiments.
Figure 2:
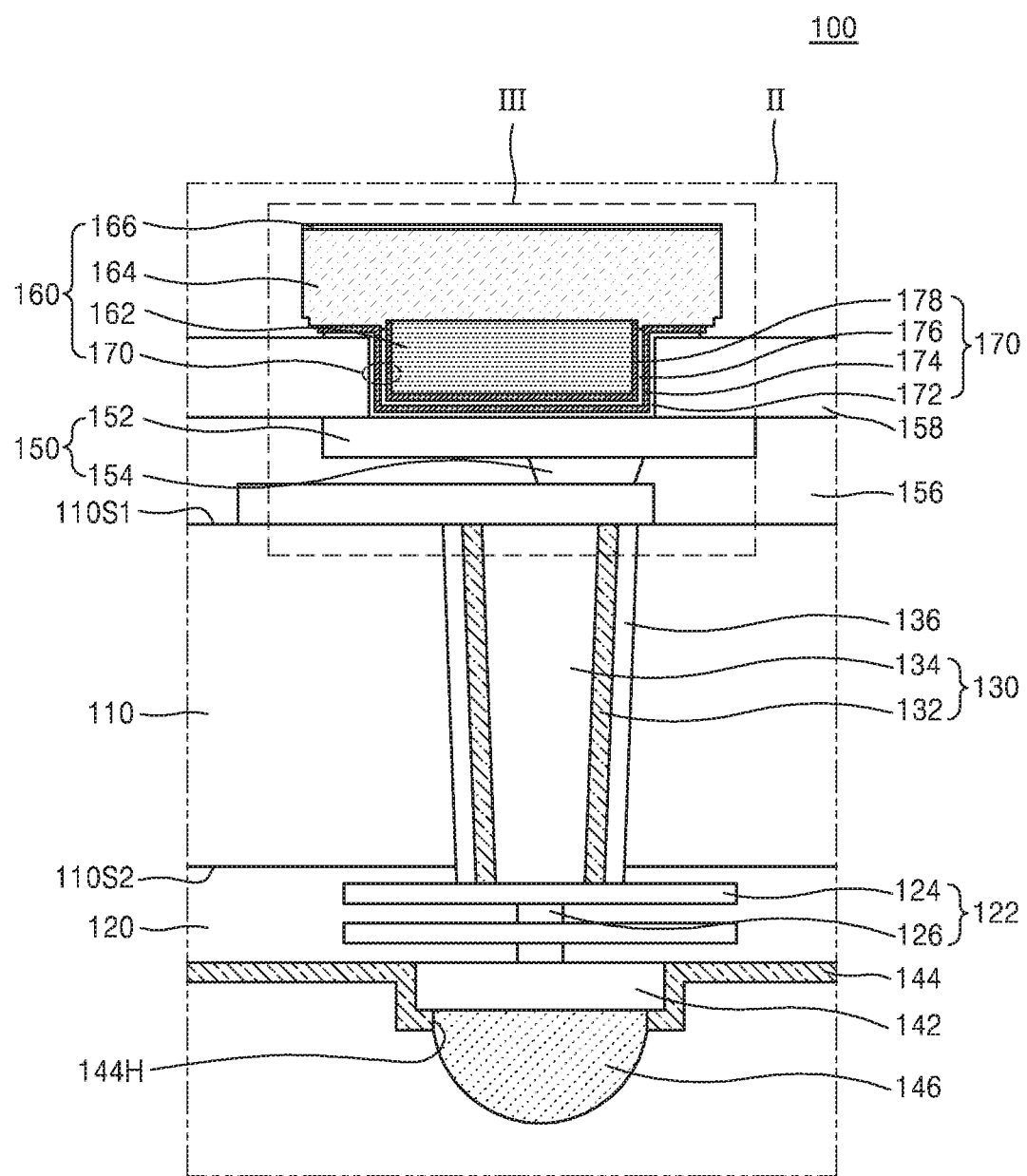
FIG. 2 is an enlarged cross-sectional view of portion II of FIG. 1.
Figure 3:
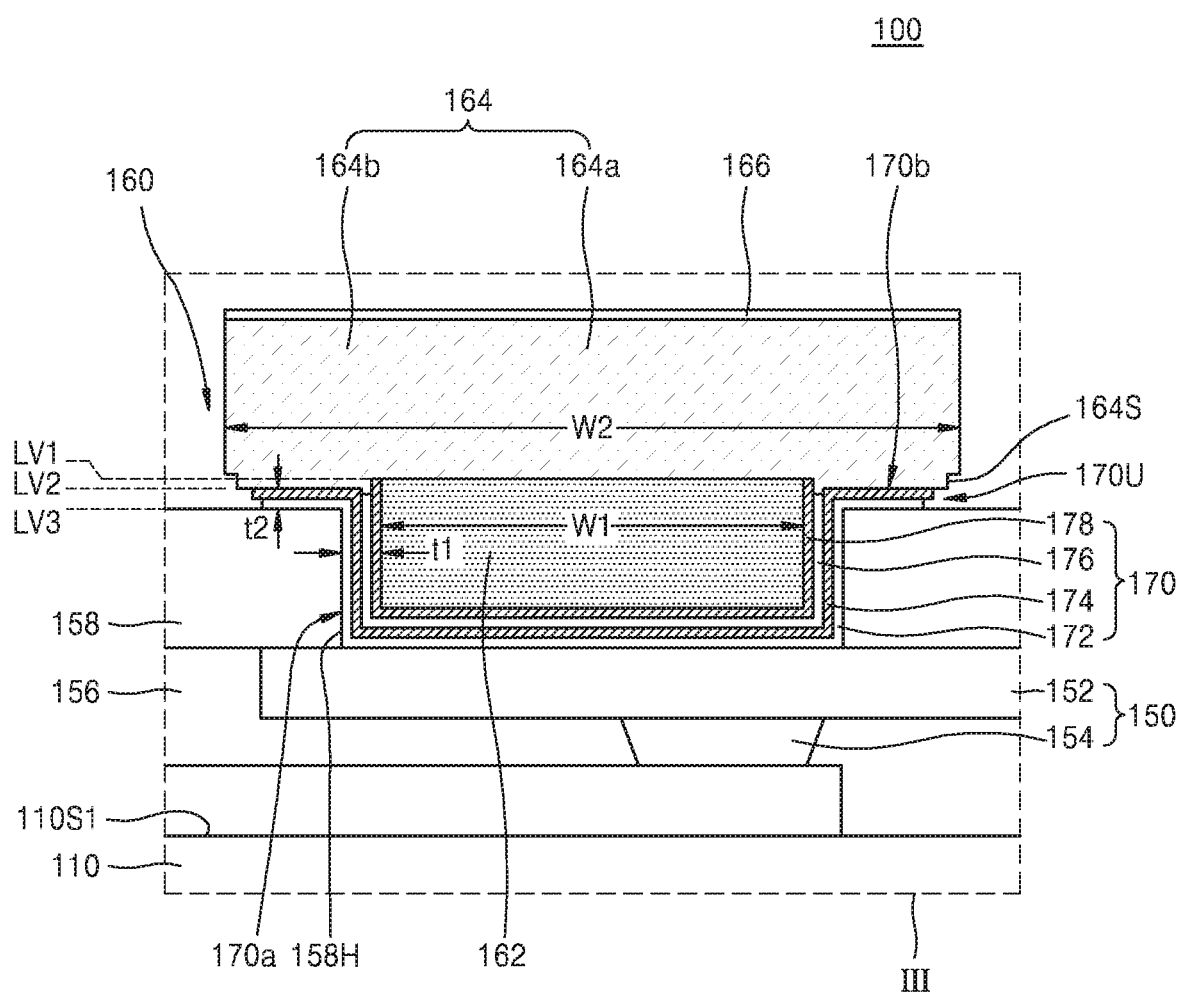
FIG. 3 is an enlarged cross-sectional view of portion III of FIG. 2.

FIG. 1 is a cross-sectional view of a semiconductor device 100 according to some embodiments. FIG. 2 is an enlarged cross-sectional view of a portion II of FIG. 1. FIG. 3 is an enlarged cross-sectional view of a portion III of FIG. 2.

Referring to FIGS. 1 to 3, a substrate 110 may include a first surface 110S1 and a second surface 110S2, which is a reverse side of the first surface 110S1. Although the terms first, second, etc. may be used herein to describe various elements, these terms are only used to distinguish one element from another element, and these elements should not be limited by these terms. Thus, a first element could be termed a second element without departing from the scope of the present inventive concepts. The substrate 110 may include, for example, silicon (Si). The substrate 110 may include a semiconductor element, such as germanium (Ge), or a compound semiconductor, such as silicon carbide (SiC), gallium arsenide (GaAs), indium arsenide (InAs), and indium phosphide (InP). The substrate 110 may have a silicon-on-insulator (SOI) structure. For example, the substrate 110 may include a buried oxide (BOX) layer. The substrate 110 may include a conductive region, for example, a doped well or a doped structure. Also, the substrate 110 may have one of various isolation structures, such as a shallow trench isolation (STI) structure.

A semiconductor device layer 120 may be located on the second surface 110S2 of the substrate 110. An element referred to as being "on" or "connected to" or "adjacent" another element (e.g., a layer or substrate), can be directly on or connected to or adjacent the other element, or intervening elements may also be present. In contrast, when an element is referred to as being "directly on" or "directly connected" or "immediately adjacent" another element, no intervening elements are present. The semiconductor device layer 120 may include a plurality of individual devices of various kinds and an interlayer insulating film. The plurality of individual devices may include various microelectronic devices, for example, metal-oxide-semiconductor field-effect transistors (MOSFETs) such as complementary metal-insulator-semiconductor (CMOS) transistors, system large-scale integration (system LSI), flash memory, dynamic random access memory (DRAM), static RAM (SRAM), electrically erasable and programmable read-only memory (EEPROM), phase-change RAM (PRAM), magnetoresistive RAM (MRAM), or resistive RAM (RRA \4), image sensors, such as CMOS imaging sensors (CISs), micro-electro-mechanical system (MEMS), active devices, and/or passive devices. The plurality of individual devices may be formed in the semiconductor device layer 120 and electrically connected to the conductive region of the substrate 110. The semiconductor device layer 120 may further include a conductive interconnection or a conductive plug configured to electrically connect at least two of the plurality of individual devices or electrically connect the plurality of individual devices with the conductive region of the substrate 110. Also, each of the plurality of individual devices may be electrically isolated from other adjacent individual devices by insulating films.

As shown in FIG. 2, the semiconductor device layer 120 may include a plurality of interconnection structures 122 configured to connect the plurality of individual devices with other interconnections formed in the substrate 110. Each of the plurality of interconnection structures 122 may include a metal interconnection layer 124 and a via plug 126. The metal interconnection layer 124 and the via plug 126 may include an interconnection barrier film and an interconnection metal layer. The interconnection barrier film may include at least one of titanium (Ti), titanium nitride (TiN), tantalum (Ta), or tantalum nitride (TaN). The interconnection metal layer may include at least one metal of tungsten (W), aluminum (Al), or copper (Cu). The metal interconnection layer 124 and the via plug 126 may include the same material. Alternatively, at least portions of the metal interconnection layer 124 and the via plug 126 may include different materials. The metal interconnection layer 124 and/or the via plug 126 may include a multi-layered structure. That is, each of the plurality of interconnection structures 122 may have a multi-layered structure obtained by alternately stacking at least two metal interconnection layers 124 or at least two via plugs 126.

A through-substrate via (TSV) 130 may extend from the first surface 110S1 to the second surface 110S2 of the substrate 110 and extend into the semiconductor device layer 120. At least a portion of the TSV 130 may have a pillar shape. The TSV 130 may include a barrier film 132 formed on a surface of the pillar-shaped portion of the TSV 130 and a buried conductive layer 134 filling the inside of the barrier film 132. The barrier film 132 may include at least one of titanium (Ti), titanium nitride (TiN), tantalum (Ta), tantalum nitride (TaN), ruthenium (Ru), cobalt (Co), manganese (Mn), tungsten nitride (WN), nickel (Ni), or nickel boron (NiB), and the buried conductive layer 134 may include at least one of Cu, a Cu alloy (e.g., CuSn, CuMg, CuNi, CuZn, CuPd, CuAu, CuRe, and CuW), W, a W alloy, Ni, Ru, or Co. A via insulating film 136 may be interposed between the substrate 110 and the TSV 130 and between the semiconductor device layer 120 and the TSV 130. The via insulating film 136 may include an oxide film, a nitride film, a carbide film, a polymer, or a combination thereof.

A connection pad 142 may be located on the semiconductor device layer 120 and electrically connected to the plurality of interconnection structures in the semiconductor device layer 120. The connection pad 142 may be electrically connected to the TSV 130 through the plurality of interconnection structures 122. The connection pad 142 may include at least one of aluminum (Al), copper (Cu), nickel (Ni), tungsten (W), platinum (Pt), or gold (Au).

A first passivation layer 144 may be formed on the semiconductor device layer 120 to cover at least a portion of the top surface of the connection pad 142. The first passivation layer 144 may be a protection layer configured to protect the plurality of interconnection structures 122 included in the semiconductor device layer 120 and other structures located thereunder from external impact and moisture. For example, the first passivation layer 144 may include an inorganic insulating film or an organic insulating film. In some embodiments, the first passivation layer 144 may include silicon nitride. An opening 144H may be formed in the first passivation layer 144 to expose at least a portion of the top surface of the connection pad 142.

A connection bump 146 may be located on the connection pad 142 and the first passivation layer 144. The connection bump 146 may be located on a lowermost surface of the semiconductor device 100. The connection bump 146 may be a connection member configured to mount the semiconductor device 100 on an external substrate or an interposer or bond the semiconductor device 100 to another semiconductor device 100. The connection bump 146 may receive at least one of a control signal for an operation of the semiconductor device 100, a power supply signal, or a ground signal from the outside (e.g., an external device), receive a data signal to be stored in the semiconductor device 100 from the outside, or provide data stored in the semiconductor device 100 to the outside.

In some embodiments, each of the connection bumps 146 may include a single layer or a stacked structure of a plurality of material layers. For example, the connection bumps 146 may include a solder material including tin (Sn), indium (In), bismuth (Bi), antimony (Sb), copper (Cu), silver (Ag), zinc (Zn), lead (Pb) and/or an alloy thereof. For example, the solder material may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, and/or Sn—Bi—Zn.

In other embodiments, the connection bumps 146 may include a solder layer connected to the connection pads 142 and a solder layer formed on the pillar layer. For example, the pillar layer may include nickel (Ni), copper (Cu), palladium (Pd), platinum (Pt), gold (Au), or an alloy thereof. The solder layer may include a solder material including tin (Sn), indium (In), bismuth (Bi), antimony (Sb), copper (Cu), silver (Ag), zinc (Zn), lead (Pb), and/or an alloy thereof.

A redistribution structure 150 may be located on the first surface 110S1 of the substrate 110 and electrically connected to the TSV 130. The redistribution structure 150 may include a plurality of redistribution lines 152. The plurality of redistribution lines 152 may be located at respective different levels from or relative to the first surface 110S1 of the substrate 110, or may be located at the same level. The plurality of redistribution lines 152 may be connected to one another through a redistribution via 154.

The plurality of redistribution lines 152 may include copper (Cu), aluminum (Al), tungsten (W), nickel (Ni), titanium (Ti), titanium nitride (TiN), tantalum (Ta), tantalum nitride (TaN), gold (Au), or a combination thereof. The redistribution vias 154 may include copper (Cu), aluminum (Al), tungsten (W), nickel (Ni), titanium (Ti), titanium nitride (TiN), tantalum (Ta), tantalum nitride (TaN), gold (Au), or a combination thereof. The redistribution via 154 may be formed by using a different process from a process of forming the plurality of redistribution lines 152. However, in another case, the redistribution via 154 may be formed by using the same process as the plurality of redistribution lines 152. For example, an opening for forming the redistribution lines 152 and an opening for forming the redistribution via 154 may be filled with a conductive material during the same process so that the redistribution via 154 may be integrated with one of the plurality of redistribution lines 152.

A redistribution insulating layer 156 may be formed on the first surface 110S1 of the substrate 110 to cover the redistribution structure 150. The redistribution insulating layer 156 may include a stacked structure of a plurality of insulating layers. The redistribution insulating layer 156 may include photosensitive polyimide, silicon nitride, silicon oxide, silicon oxynitride, or a combination thereof.

A second passivation layer 158 may be formed on the redistribution insulating layer 156. The second passivation layer 158 may include an opening 158H exposing at least a portion of the redistribution line 152. The second passivation layer 158 may include photosensitive polyimide, silicon nitride, silicon oxide, silicon oxynitride, or a combination thereof. The second passivation layer 158 may include the same material as the redistribution insulating layer 156 or include a different material from the redistribution insulating layer 156.

A pad structure 160 may be formed on the second passivation layer 158 and electrically connected to the redistribution line 152. The pad structure 160 may include a first pad layer 162, a second pad layer 164, a capping layer 166, and a lower conductive layer 170.

As shown in FIG. 3, the lower conductive layer 170 may be conformally formed on the second passivation layer 158, a sidewall of the opening 158H, and on a top surface of the redistribution line 152 exposed by the opening 158H. The lower conductive layer 170 may include a conductive barrier layer 172, a first seed layer 174, an etch stop layer 176, and a second seed layer 178.

The conductive barrier layer 172 may serve as a barrier to prevent a metal material included in the pad structure 160 from penetrating or diffusing into the second passivation layer 158 or the redistribution insulating layer 156. Also, the conductive barrier layer 172 may serve as an adhesive layer capable of providing sufficient adhesion of the first seed layer 174 with the second passivation layer 158. In some embodiments, the conductive barrier layer 172 may include titanium (Ti), titanium nitride (TiN), tantalum (Ta), tantalum nitride (TaN), titanium-tungsten (Ti—W), chromium (Cr), aluminum (Al), or a combination thereof. For example, the conductive barrier layer 172 may include titanium (Ti). In some embodiments, the conductive barrier layer 172 may have a thickness of about 500 Å to about 5000 Å, but the inventive concepts are not limited thereto.

The first seed layer 174 may act as a seed layer or a template for forming the second pad layer 164 located on a top surface of the second passivation layer 158. In some embodiments, the first seed layer 174 may include copper (Cu), chromium-copper (Cr—Cu), palladium (Pd), platinum (Pt), gold (Au), or a combination thereof. In some embodiments, the first seed layer 174 may include copper (Cu). In some embodiments, although the first seed layer 174 may have a thickness of about 500 Å to about 5000 Å, the inventive concepts is not limited thereto.

The etch stop layer 176 may include a material having an etch selectivity with respect to the first pad layer 162. For example, the etch stop layer 176 may serve as an etch stopper during a process of etching back the first pad layer 162 to fill the opening 158H. In some embodiments, the etch stop layer 176 may include titanium (Ti), titanium nitride (TiN), tantalum (Ta), tantalum nitride (TaN), titanium-tungsten (Ti—W), chromium (Cr), aluminum (Al), or a combination thereof. In some embodiments, the etch stop layer 176 may include titanium (Ti). In some embodiments, the etch stop layer 176 may have a thickness of about 50 Å to about 3000 Å, but the inventive concepts are not limited thereto.

The second seed layer 178 may act as a seed layer or a template for forming the first pad layer 162. In some embodiments, the second seed layer 178 may include copper (Cu), chromium-copper (Cr—Cu), palladium (Pd), platinum (Pt), gold (Au), or a combination thereof. In some embodiments, the second seed layer 178 may include copper (Cu). In some embodiments, the second seed layer 178 may have a thickness of about 50 Å to about 5000 Å, but the inventive concepts are not limited thereto.

The first pad layer 162 may fill the remaining space of the opening 158H on the lower conductive layer 170. The first pad layer 162 may include copper (Cu), chromium-copper (Cr—Cu), palladium (Pd), platinum (Pt), gold (Au), or a combination thereof. The second pad layer 164 may be formed on the second passivation layer 158 to cover the first pad layer 162. The second pad layer 164 may include nickel (Ni), aluminum (Al), tungsten (W), platinum (Pt), gold (Au), or a combination thereof. The capping layer 166 may be formed on a top surface of the second pad layer 164. The capping layer 166 may include gold (Au), platinum (Pt), silver (Ag), tungsten (W), or a combination thereof.

As shown in FIG. 3, the first pad layer 162 may have a first width W1 along a first direction parallel to the first surface 110S1 of the substrate 110, and the second pad layer 164 may have a second width W2 greater than the first width W1 along the first direction. Also, the second pad layer 164 may cover substantially the entire top surface of the first pad layer 162. Thus, the first pad layer 162 may not be exposed outside the pad structure 160.

For example, when a metal material (e.g., copper (Cu)) included in the first pad layer 162 is exposed by an outer sidewall of the pad structure 160, the metal material may contact and react with a solder material located on the pad structure 160 during a process of bonding semiconductor devices, thereby generating an inter-metallic compound (IMC). When the IMC is generated, voids may be formed in the solder material, and bonding reliability of the semiconductor devices may be degraded. However, according to some embodiments, since the top surface of the first pad layer 162 is completely covered with the second pad layer 164, the above-described generation of the IMC may be reduced or prevented, so that the semiconductor device 100 may be reliably bonded to another semiconductor device.

As shown in FIG. 3, the lower conductive layer 170 may include a first portion 170a surrounding a sidewall and a bottom surface of the first pad layer 162 and a second portion 170b located between the second pad layer 164 and the second passivation layer 158. The first portion 170a of the lower conductive layer 170 may have a stacked structure of the conductive barrier layer 172, the first seed layer 174, the etch stop layer 176, and the second seed layer 178. In contrast, the second portion 170b of the lower conductive layer 170 (e.g., a peripheral portion of the lower conductive layer 170 located on the second passivation layer 158) may have a stacked structure of only the conductive barrier layer 172 and the first seed layer 174. Thus, a first thickness t1 of the first portion 170a of the lower conductive layer 170 may be greater than a second thickness t2 of the second portion 170b of the lower conductive layer 170. Here, each of the first thickness t1 and the second thickness t2 may refer to a thickness of the lower conductive layer 170 in a direction perpendicular to a direction in which the lower conductive layer 170 extends. The second portion 170b of the lower conductive layer 170 may have a smaller thickness than the first portion 170a due to the fact that the second seed layer 178 in the second portion 170b is removed together during the process of etching back the first pad layer 162 by using the etch stop layer 176 as an etch stopper, and the etch stop layer 176 in the second portion 170b is also subsequently removed.

As shown in FIG. 3, the second pad layer 164 may include a first portion 164a and a second portion 164b. The first portion 164a of the second pad layer 164 may be in contact with the top surface of the first pad layer 162, and the second portion 164b of the second pad layer 164 may be in contact with a top surface of the first seed layer 174. This may be due to the fact that, as described above, the second seed layer 178 in the second portion 170b is removed together during the process of etching back the first pad layer 162 by using the etch stop layer 176 as an etch stopper, and the etch stop layer 176 in the second portion 170b is also subsequently removed.

In the process of forming the second pad layer 164 according to some embodiments, after the etch stop layer 176 is removed, the first seed layer 174 may be exposed, and the second pad layer 164 may be formed by using the first seed layer 174 and the first pad layer 162 as a seed layer. In particular, since a peripheral portion (i.e., the second portion 164b) of the second pad layer 164 is formed by using the first seed layer 174 as a seed layer, the entire area of the second pad layer 164 may be formed to a relatively uniform height and have a substantially planar top surface.

As shown in FIG. 3, a bottom level LV1 of the first portion 164a of the second pad layer 164 may be higher than a bottom level LV2 of the second portion 164b of the second pad layer 164 on the basis of or relative to a first surface 110S1 of the substrate 110. Also, the bottom level LV1 of the first portion 164a of the second pad layer 164 and the bottom level LV2 of the second portion 164b of the second pad layer 164 may be higher than a top level LV3 of the second passivation layer 158 on the basis of or relative to the first surface 110S1 of the substrate 110. Spatially relative terms, such as "beneath," "below," "lower," "higher," "above," "upper," and the like, may encompass different orientations of the device in use or operation in addition to the orientation depicted in the figures. For example, if the device in the figures is turned over, elements described as "below" or "beneath" other elements or features would then be oriented "above" the other elements or features.

In other words, the top surface of the first pad layer 162 may be at substantially the same level as or a similar level to the bottom level LV1 of the first portion 164a of the second pad layer 164. Also, an uppermost surface of the second seed layer 178 surrounding the sidewall and the bottom surface of the first pad layer 162 may also be at substantially the same level as or a similar level to the bottom level LV1 of the first portion 164a of the second pad layer 164. In the process of forming the first pad layer 162, after the first pad layer 162 is formed to fill the opening 158H, the top surface of the first pad layer 162 may become coplanar with the top surface of the second seed layer 178 due to a process of etching back the first pad layer 162 and the second seed layer 178 until the top surface of the etch stop layer 176 is exposed.

As shown in FIG. 3, an undercut region 170U may be defined at a position from which edge portions of the first seed layer 174 and the conductive barrier layer 172 are removed, between the peripheral portion of the second pad layer 164 (e.g., the second portion 164b of the second pad layer 164) and the second passivation layer 158. The undercut region 170U may be defined as described above due to the fact that after the second pad layer 164 is formed, the edge portions of the first seed layer 174 and the conductive barrier layer 172 may also be removed together during the process of removing the first seed layer 174 and the conductive barrier layer 172 formed on the top surface of the second passivation layer 158. During the removal process, an edge portion of the second pad layer 164 also be removed together so that a stepped portion 164S may be formed in the edge portion of the second pad layer 164.

In some embodiments, as shown in FIG. 3, a side surface of the conductive barrier layer 172 adjacent to the undercut region 170U may be recessed more inwardly than a side surface of the first seed layer 174. In other words, a length of a portion of the conductive barrier layer 172 located on the top surface of the second passivation layer 158 may be smaller than a length of a portion of the first seed layer 174 located on the top surface of the second passivation layer 158 such that the first seed layer 174 extends beyond the conductive barrier layer 172. This may be due to the fact that a portion of the conductive barrier layer 172 located under the peripheral portion of the second pad layer 164 may be further removed during a process of sequentially removing the portion of the first seed layer 174 and the portion of the conductive barrier layer 172, which are not covered with the second pad layer 164, by using a wet etching process after the second pad layer 164 is formed. However, the inventive concepts are not limited thereto. For example, In contrast with FIG. 3, the side surfaces of the conductive barrier layer 172 and the first seed layer 174 may be aligned with each other. In other words, the length of the portion of the conductive barrier layer 172 located on the top surface of the second passivation layer 158 may be equal to the length of the portion of the first seed layer 174 located on the top surface of the second passivation layer 158.

In some embodiments, an uppermost surface of the etch stop layer 176 surrounding a sidewall of the first pad layer 162 may be at a lower level than the uppermost level of the second seed layer 178 (e.g., a level substantially equal or similar to the bottom level LV1 of the first portion 164a of the second pad layer 164) relative to the first surface 110S1 of the substrate 110. Also, the uppermost surface of the etch stop layer 176 surrounding the sidewall of the first pad layer 162 may be at a lower level than an uppermost level of the first seed layer 174 (e.g., a level substantially equal or similar to the bottom level LV2 of the second portion 164b of the second pad layer 164) relative to the first surface 110S1 of the substrate 110. This may be due to the fact that a portion of the etch stop layer 176 surrounding the sidewall of the first pad layer 162 may be further removed during a process of sequentially removing a portion of the second seed layer 178 and a portion of the etch stop layer 176, which are not covered with the first pad layer 162, by using a wet etching process after the first pad layer 162 is formed. Alternatively, in contrast with FIG. 3, the uppermost surface of the etch stop layer 176 surrounding the sidewall of the first pad layer 162 may be at substantially the same level as the uppermost level of the first seed layer 174.

FIG. 3 illustrates an example in which the opening 158H of the second passivation layer 158 exposes a portion of the redistribution line 152, and the pad structure 160 is in contact with the redistribution line 152 in the opening 158H. However, in other embodiments, the redistribution insulating layer 156 may include an opening exposing a top surface of the TSV 130, and the pad structure 160 may be in contact with the top surface of the TSV 130 in the opening such that the redistribution structure 150 is not disposed between the pad structure 160 and the TSV 130.

Although FIG. 2 illustrates an example in which the connection pad 142 includes a single layer, the inventive concepts is not limited thereto. The connection pad 142 also may have a similar structure to the pad structure 160. For example, the pad structure 160 including the lower conductive layer 170, the first pad layer 162, the second pad layer 164, and the capping layer 166 may be formed instead of the connection pad 142 on the second surface 110S2 of the substrate 110, and the connection bump 146 may be formed on the pad structure 160.

Hereinafter, characteristics of the pad structure 160 of the semiconductor device 100 according to some embodiments will be described in comparison to the devices of FIGS. 15A and 15B.

Figure 15A:
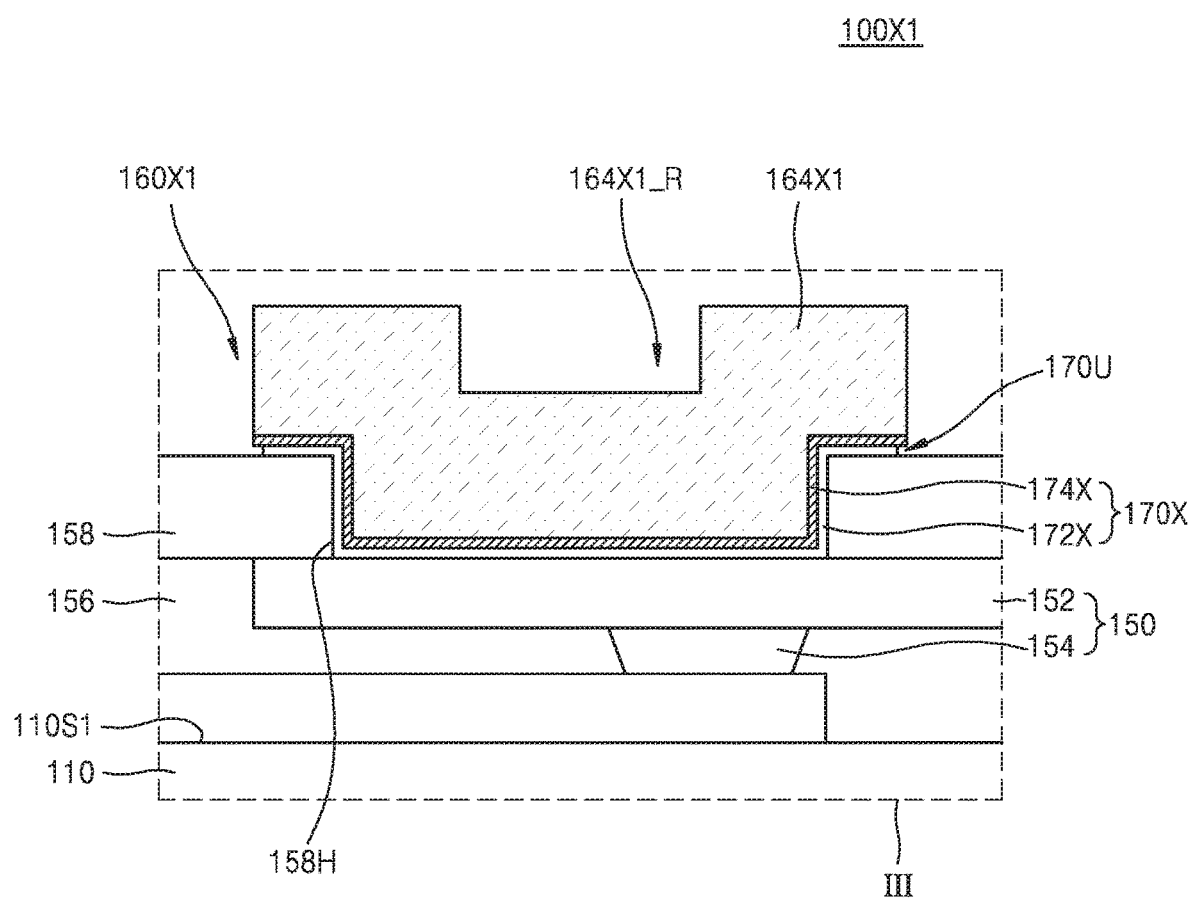
FIGS. 15A and 15B are cross-sectional views of semiconductor devices according to comparative examples.
Figure 15B:
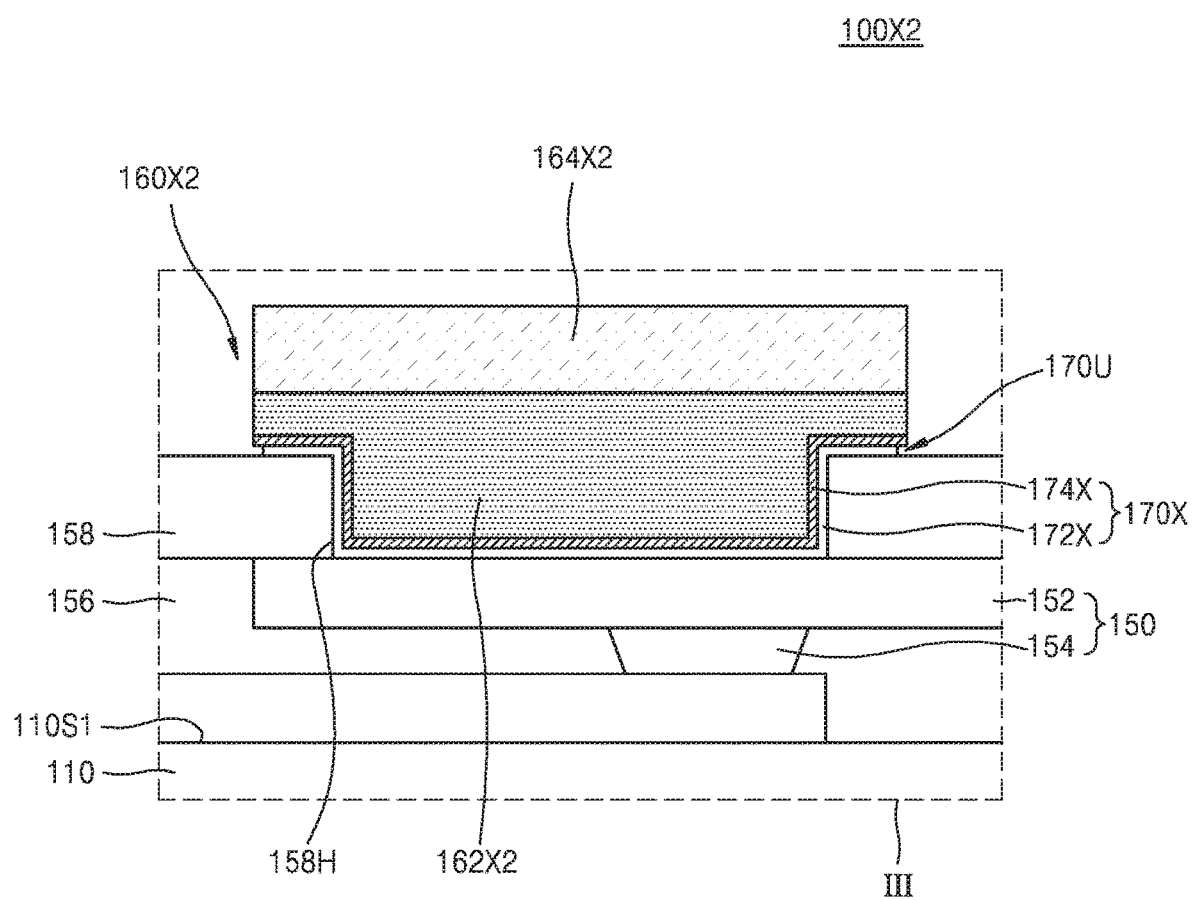

FIGS. 15A and 15B are cross-sectional views of semiconductor devices 100X1 and 100X2 according to comparative examples.

Referring to FIG. 15A, the semiconductor device 100X1 may include a pad structure 160X1 including an upper pad layer 164X1 and a lower conductive layer 170X. The lower conductive layer 170X may include a conductive barrier layer 172X and a seed layer 174X, and the upper pad layer 164X1 may be formed on the lower conductive layer 170X to fill an opening 158H of a second passivation layer 158. A recess 164X1_R may be provided in an upper portion of the upper pad layer 164X1. Due to a relatively large height difference between a top surface of the second passivation layer 158 and a bottom surface of the opening 158H, a level difference may occur in a top surface of the upper pad layer 164X1 during the process of filling the opening 158H with the upper pad layer 164X1, thereby generating the recess 164X1_R. In a process of bonding the semiconductor device 100X1 to a connection bump of another semiconductor device, residues of organic materials, such as an under-fill member, may be trapped in the recess 164X1_R, thereby degrading the bonding reliability of the semiconductor device 100X1.

Referring to FIG. 15B, the semiconductor device 100X2 may include a pad structure 160X2 including a lower pad layer 162X2, an upper pad layer 164X2, and a lower conductive layer 170X. The lower conductive layer 170X may include a conductive barrier layer 172X and a seed layer 174X, and the lower pad layer 162X2 may be formed on the lower conductive layer 170X to fill an opening 158H of a second passivation layer 158. The upper pad layer 164X2 may be formed on the lower pad layer 162X2. The upper pad layer 164X2 may not be in direct contact with the lower conductive layer 170X, and the lower pad layer 162X2 may be exposed by a sidewall of the pad structure 160X2. The lower pad layer 162X2 may have relatively good gap-filling characteristics. Thus, the lower pad layer 162X2 may have a planar top surface irrespective of a relatively high height difference between the top surface of the second passivation layer 158 and the bottom surface of the opening 158H. Accordingly, the upper pad layer 164X2 also may have a planar top surface conforming to a shape of the top surface of the lower pad layer 162X2. However, in the process of bonding the semiconductor device 100X2 to the connection bump of another semiconductor device, a solder material included in the connection bump may flow along the sidewall of the pad structure 160X2 and contact and react with the lower pad layer 162X2 to generate an IMC. When the IMC is generated, voids may be formed in the solder material, and bonding reliability of the semiconductor device 100X2 may be degraded.

In contrast, in the semiconductor device 100 according to embodiments described with reference to FIGS. 1 to 3, a first pad layer 162 and a second pad layer 164 may be formed on a lower conductive layer 170 including a conductive barrier layer 172, a first seed layer 174, an etch stop layer 176, and a second seed layer 178. In particular, in a process of manufacturing the semiconductor device 100, the first pad layer 162 may be etched back until a top surface of the etch stop layer 176 is exposed, and an exposed portion of the etch stop layer 176 may be removed to expose a portion of the first seed layer 174 located on a top surface of the second passivation layer 158. Thereafter, the second pad layer 164 may be formed by using the first pad layer 162 and the first seed layer 174 as a seed layer. Accordingly, the entire area of a top surface of the second pad layer 164 may be substantially planar. Thus, the trapping of an organic material into a solder layer may be reduced or prevented during a process of bonding the semiconductor device 100 with another semiconductor device. Also, since the first pad layer 162 is not exposed outside the pad structure 160, generation of an inter-metallic compound (IMC) due to a contact of the solder layer with the first pad layer 162 may be reduced or prevented. Accordingly, the semiconductor device 100 may have higher reliability.

Figure 4:
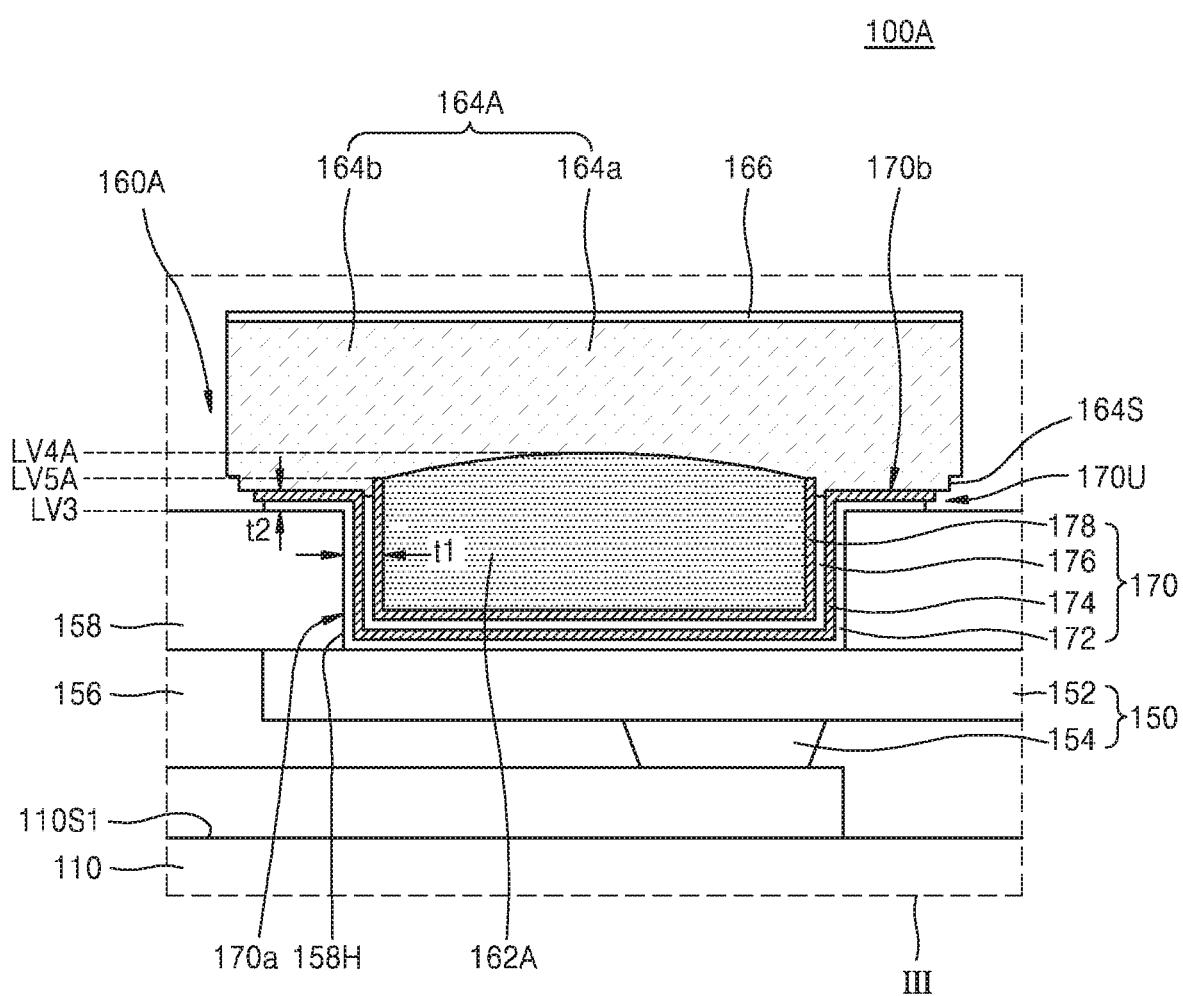
FIGS. 4, 5, 6, 7, 8, 9, 10, 11, 12, 13, and 14 are cross-sectional views of semiconductor devices according to some embodiments.

FIG. 4 is a cross-sectional view of a semiconductor device 100A according to some embodiments. In FIG. 4, the same reference numerals are used to denote the same elements as in FIGS. 1 to 3.

Referring to FIG. 4, a pad structure 160A may include a first pad layer 162A and a second pad layer 164A having different top profiles. The first pad layer 162A may have a convex top profile, and the second pad layer 164A may have a concave bottom profile conforming to the top profile of the first pad layer 162A. For example, a top level LV4A of a central portion of the first pad layer 162A may be higher than a top level LV5A of a peripheral portion of the first pad layer 162A relative to the first surface 110S1 of the substrate 110.

In a process of forming the pad structure 160A according to some embodiments, after the mold layer (refer to 410 in FIG. 20) having the pad space (refer to 410H in FIG. 20) that is connected to the opening 158H is formed on the second passivation layer 158, the first pad layer 162A may be formed to fill the opening 158H and the pad space 410H, and etched back until the top surface of the etch stop layer 176 is exposed. In this case, a difference in etch rate may partially occur in the first pad layer 162A depending on a width or depth of the pad space 410H or etchback process conditions. For example, the peripheral portion of the first pad layer 162A may be etched back at a relatively high etch rate. Thus, the first pad layer 162A may have a convex top profile.

Figure 5:
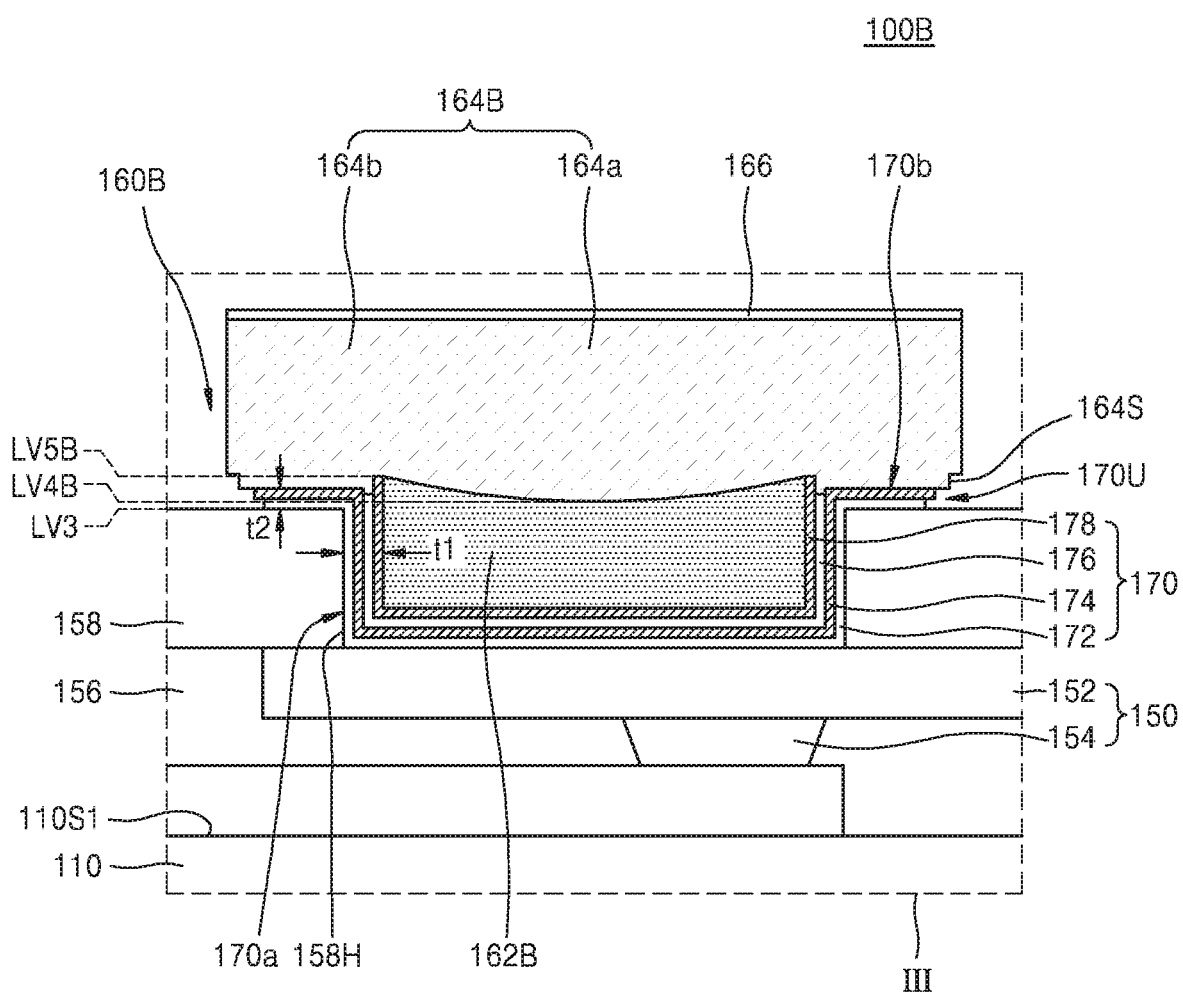

FIG. 5 is a cross-sectional view of a semiconductor device 100B according to some embodiments. In FIG. 5, the same reference numerals are used to denote the same elements as in FIGS. 1 to 4.

Referring to FIG. 5, a pad structure 160B may include a first pad layer 162B and a second pad layer 164B having different top profiles. The first pad layer 162B may have a concave top profile, and the second pad layer 164B may have a convex bottom profile conforming to the top profile of the first pad layer 162B. For example, a top level LV4B of a central portion of the first pad layer 162B may be lower than a top level LV5 of a peripheral portion of the first pad layer 162B relative to the first surface 110S1 of the substrate 110.

In a process of forming the pad structure 160B according to some embodiments, after the mold layer (refer to 410 in FIG. 20) having the pad space (refer to 410H in FIG. 20) that is connected to the opening 158H is formed on the second passivation layer 158, the first pad layer 162A may be formed to fill the opening 158H and the pad space 410H, and etched back until the top surface of the etch stop layer 176 is exposed. In this case, a difference in etch rate may partially occur in the first pad layer 162B depending on a width or depth of the pad space 410H or etchback process conditions. For example, the central portion of the first pad layer 162B may be etched back at a relatively high etch rate. Thus, the first pad layer 162B may have a concave top profile.

Figure 6:
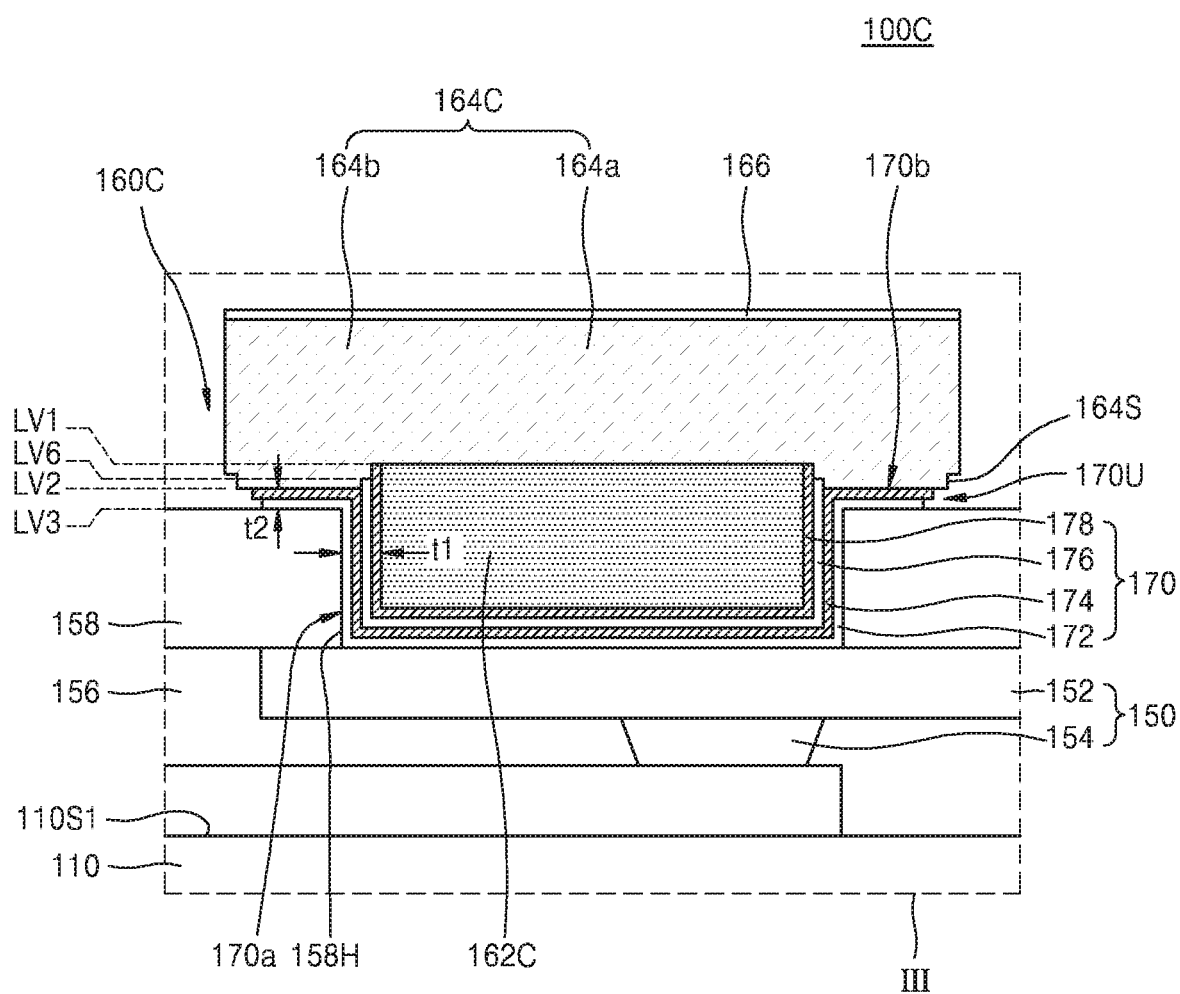

FIG. 6 is a cross-sectional view of a semiconductor device 100C according to some embodiments. In FIG. 6, the same reference numerals are used to denote the same elements as in FIGS. 1 to 5.

Referring to FIG. 6, a pad structure 160C may include a first pad layer 162C and an etch stop layer 176 having different top levels. An uppermost level LV6 of the etch stop layer 176 surrounding a sidewall of the first pad layer 162C may be lower than an uppermost level of a second seed layer 178 (e.g., a level substantially equal or similar to a bottom level LV1 of a first portion 164a of a second pad layer 164C) relative to the first surface 110S1 of the substrate 110. Also, the uppermost level LV6 of the etch stop layer 176 surrounding the sidewall of the first pad layer 162C may be higher than an uppermost level of a first seed layer 174 (e.g., a level substantially equal or similar to a bottom level LV2 of a second portion 164b of the second pad layer 164).

Figure 7:
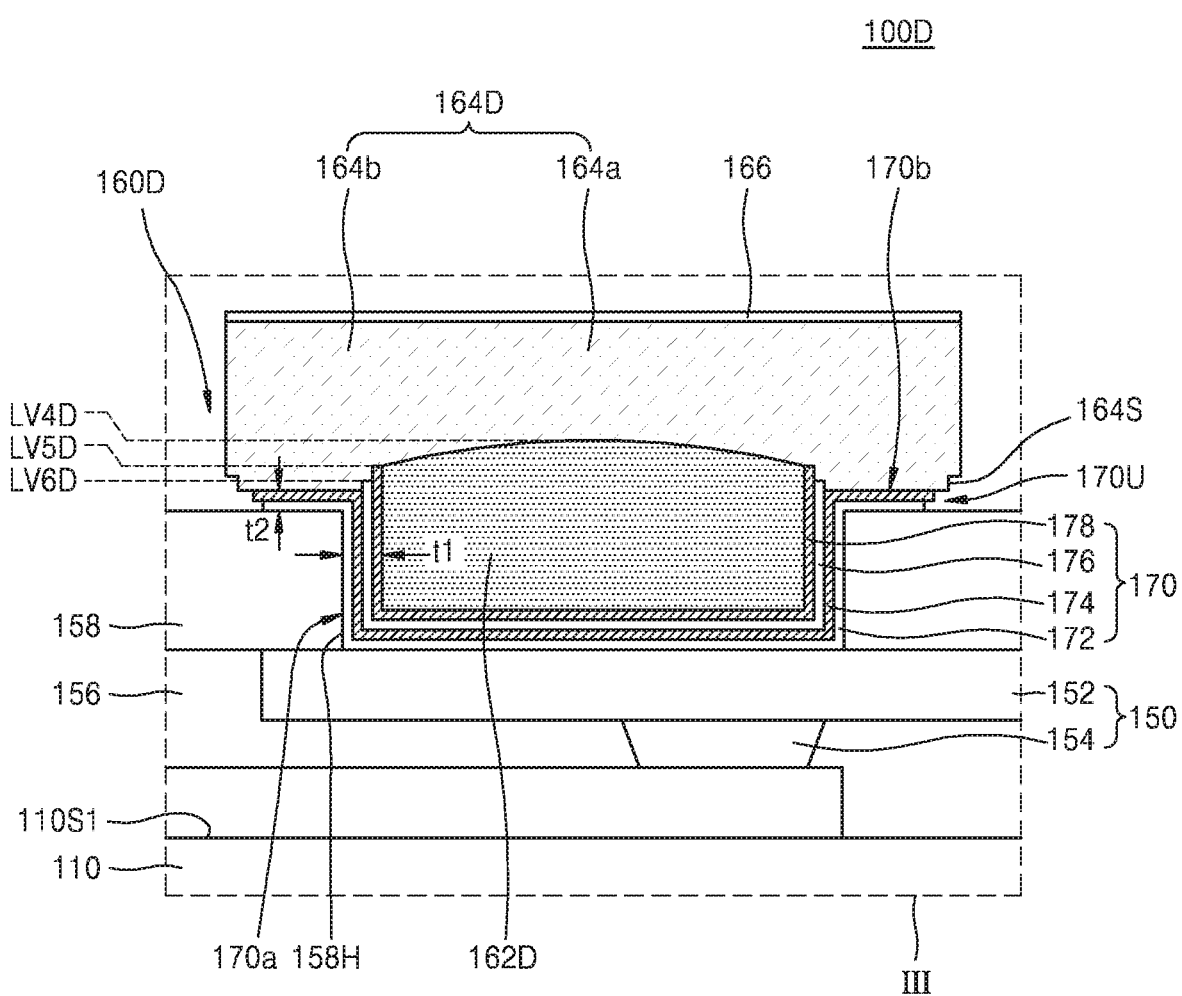

FIG. 7 is a cross-sectional view of a semiconductor device 100D according to some embodiments. In FIG. 7, the same reference numerals are used to denote the same elements as in FIGS. 1 to 6.

Referring to FIG. 7, a pad structure 160D may include a first pad layer 162D and an etch stop layer 176 having different top levels. The first pad layer 162D may have a convex top profile, and the second pad layer 164D may have a concave bottom profile conforming to the top profile of the first pad layer 162D. For example, a top level LV4D of a central portion of the first pad layer 162D may be higher than a top level LV5D of a peripheral portion of the first pad layer 162D relative to the first surface 110S1 of the substrate 110.

In addition, an uppermost level LV6D of the etch stop layer 176 surrounding a sidewall of the first pad layer 162D may be lower than the top level LV5D of the peripheral portion of the first pad layer 162D relative to the first surface 110S1 of the substrate 110.

Figure 8:
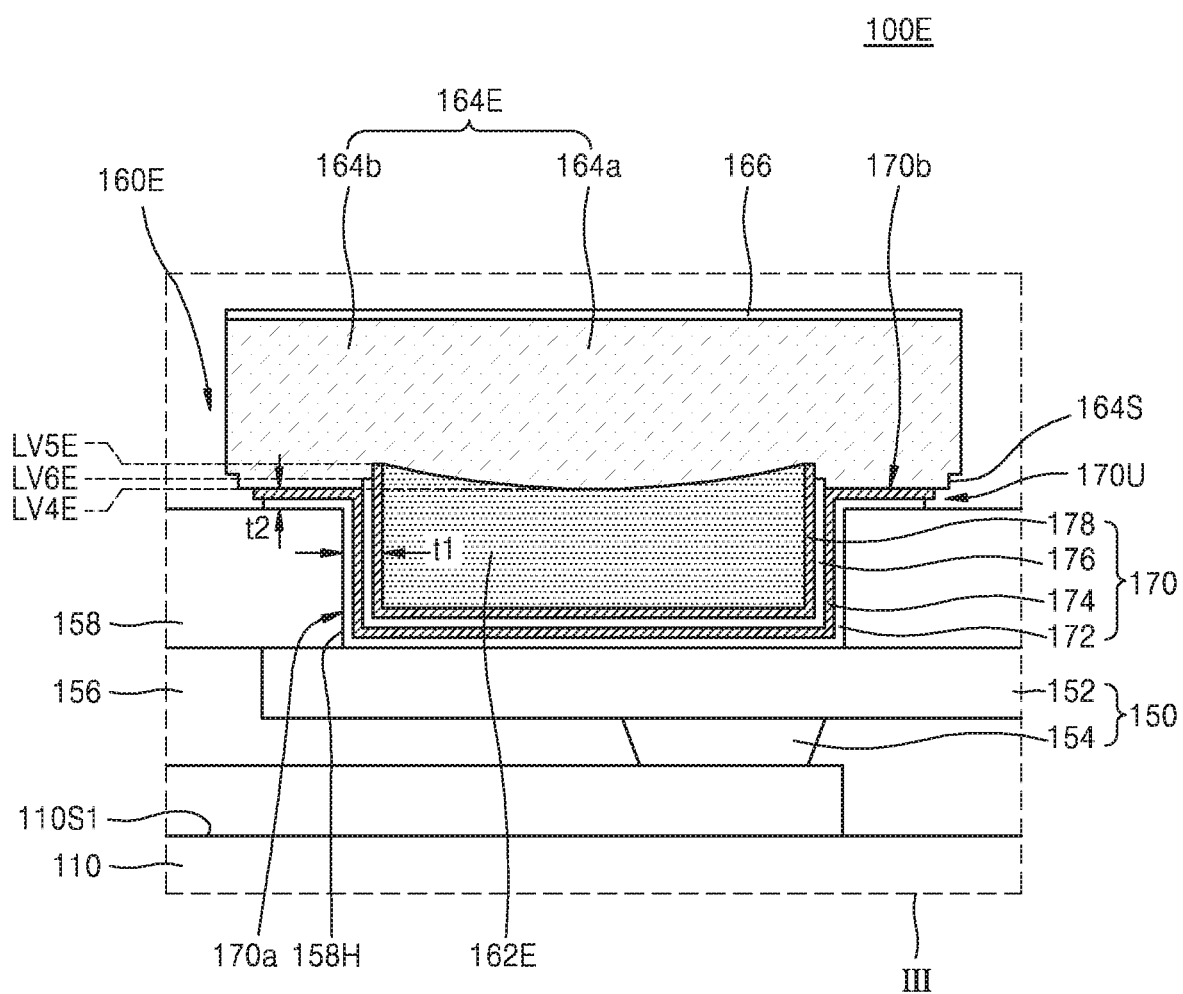

FIG. 8 is a cross-sectional view of a semiconductor device 100E according to some embodiments. In FIG. 8, the same reference numerals are used to denote the same elements as in FIGS. 1 to 7.

Referring to FIG. 8, a pad structure 160E may include a first pad layer 162E and an etch stop layer 176 having different top levels. The first pad layer 162E may have a concave top profile, and the second pad layer 164E may have a convex bottom profile conforming to the top profile of the first pad layer 162E. For example, a top level LV4E of a central portion of the first pad layer 162E may be lower than a top level LV5E of a peripheral portion of the first pad layer 162E relative to the first surface 110S1 of the substrate 110. Also, an uppermost level LV6E of the etch stop layer 176 surrounding a sidewall of the first pad layer 162E may be lower than the top level LV5E of the peripheral portion of the first pad layer 162E relative to the first surface 110S1 of the substrate 110. FIG. 8 illustrates an example in which the uppermost level LV6E of the etch stop layer 176 surrounding the sidewall of the first pad layer 162E is higher than the top level LV4E of the central portion of the first pad layer 162E relative to the first surface 110S1 of the substrate 110. However, in another case, the uppermost level LV6E of the etch stop layer 176 may be lower than the top level LV4E of the central portion of the first pad layer 162E relative to the first surface 110S1 of the substrate 110.

Figure 9:
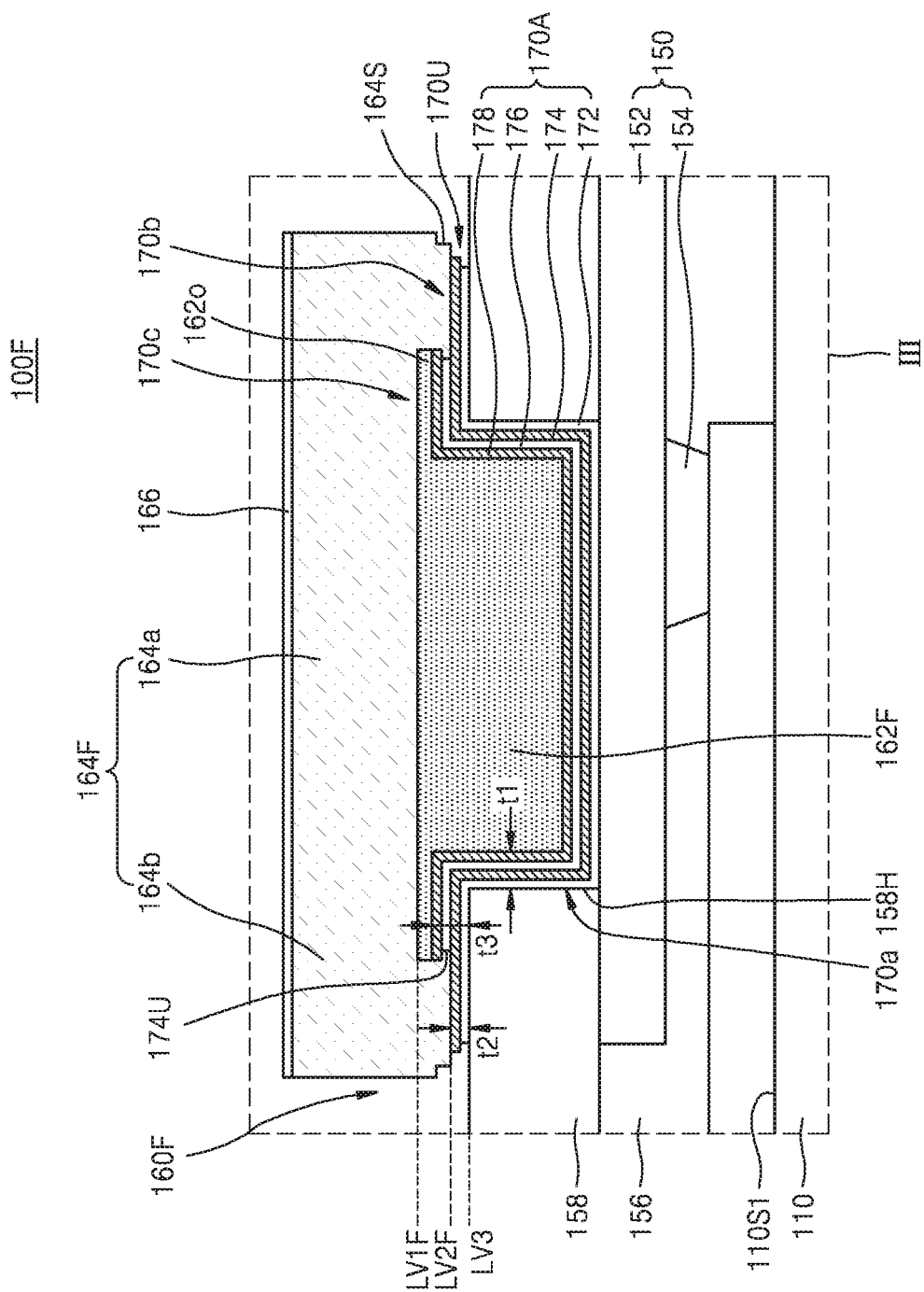

FIG. 9 is a cross-sectional view of a semiconductor device 100F according to some embodiments. In FIG. 9, the same reference numerals are used to denote the same elements as in FIGS. 1 to 8.

Referring to FIG. 9, a pad structure 160F may include a first pad layer 162F including a protrusion 162o extending on a top surface of a second passivation layer 158. The protrusion 162o may be located in a peripheral portion of the first pad layer 162F and extend outward on the top surface of the second passivation layer 158. A conductive barrier layer 172, a first seed layer 174, an etch stop layer 176, and a second seed layer 178 may be sequentially located between the second passivation layer 158 and the protrusion 162o.

A lower conductive layer 170A may include a first portion 170a, a second portion 170b, and a third portion 170c. The first portion 170a may surround a sidewall and a bottom surface of the first pad layer 162F on an inner wall or sidewall of the opening 158H. The second portion 170b may be located between the second passivation layer 158 and a second portion 164b of a second pad layer 164F. The third portion 170c may be located between the second passivation layer 158 and the protrusion 162o of the first pad layer 162F. An undercut region 174U may be formed under a peripheral portion of the protrusion 162o, and a side surface of the etch stop layer 176 may be recessed more inwardly than a side surface of the second seed layer 178 in the undercut region 174U.

The first portion 170a and the third portion 170c of the lower conductive layer 170A may have a stacked structure of the conductive barrier layer 172, the first seed layer 174, the etch stop layer 176, and the second seed layer 178. In contrast, the second portion 170b of the lower conductive layer 170A may have a stacked structure of only the conductive barrier layer 172 and the first seed layer 174. Thus, each of a first thickness t1 of the first portion 170a of the lower conductive layer 170A and a third thickness t3 of the third portion 170c of the lower conductive layer 170A may be greater than a second thickness t2 of the second portion 170b of the lower conductive layer 170A.

As shown in FIG. 9, a bottom level LV1F of a first portion 164a of the second pad layer 164F may be higher than a bottom level LV2F of the second portion 164bb of the second pad layer 164F on the basis of or relative to a first surface 110S1 of a substrate 110.

Figure 10:
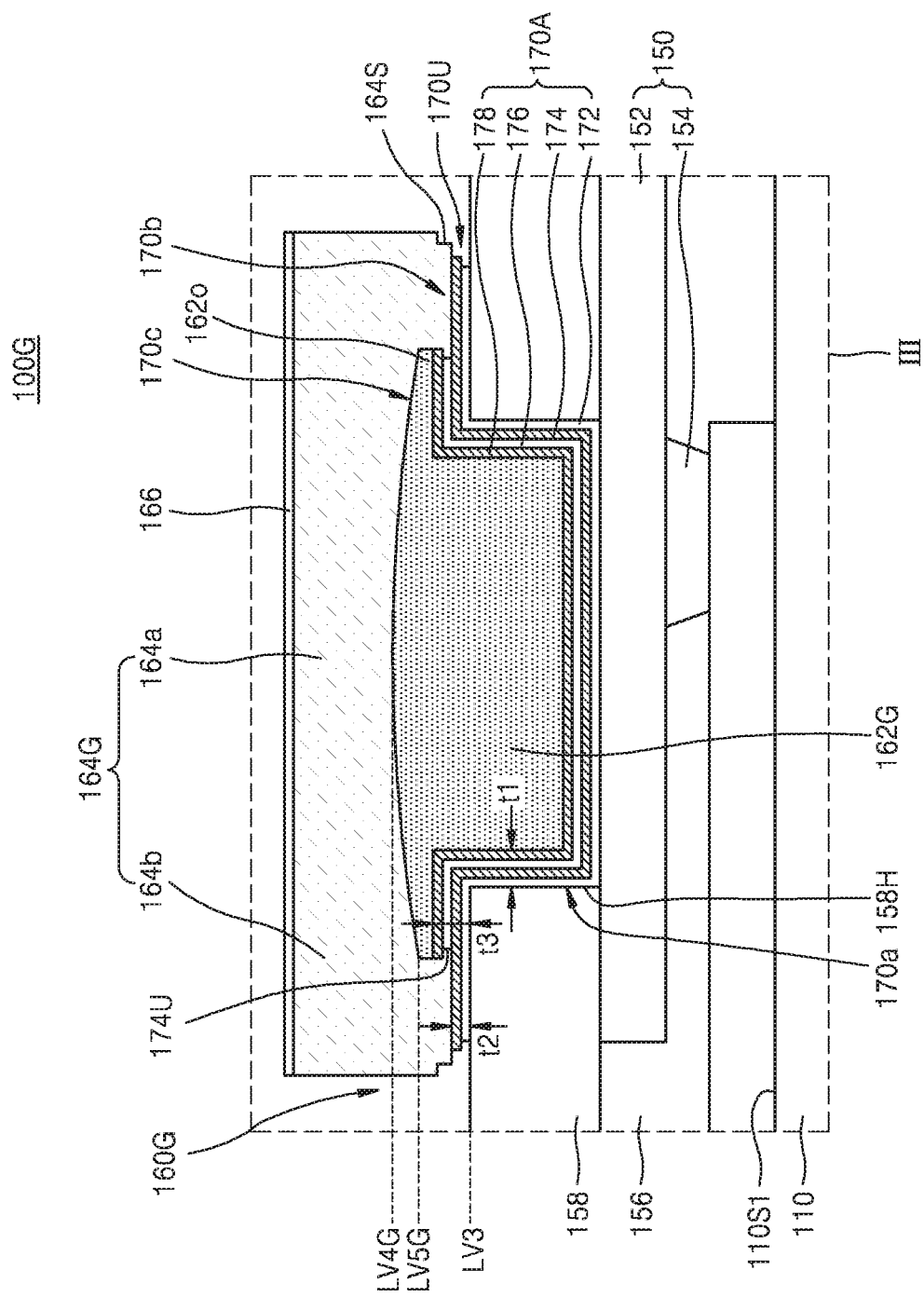

FIG. 10 is a cross-sectional view of a semiconductor device 100G according to some embodiments. In FIG. 10, the same reference numerals are used to denote the same elements as in FIGS. 1 to 9.

Referring to FIG. 10, a pad structure 160G may include a first pad layer 162G including a protrusion 162o extending on a top surface of a second passivation layer 158. The first pad layer 162G may have a convex top profile. A second pad layer 164G may have a concave bottom profile conforming to the top profile of the first pad layer 162G. For example, a top level LV4G of a central portion of the first pad layer 162G may be higher than a top level LV5G of a peripheral portion of the first pad layer 162G relative to the first surface 110S1 of the substrate 110.

The protrusion 162o may be located in the peripheral portion of the first pad layer 162G and extend outward on the top surface of the second passivation layer 158. A conductive barrier layer 172, a first seed layer 174, an etch stop layer 176, and a second seed layer 178 may be sequentially located between the second passivation layer 158 and the protrusion 162o.

Figure 11:
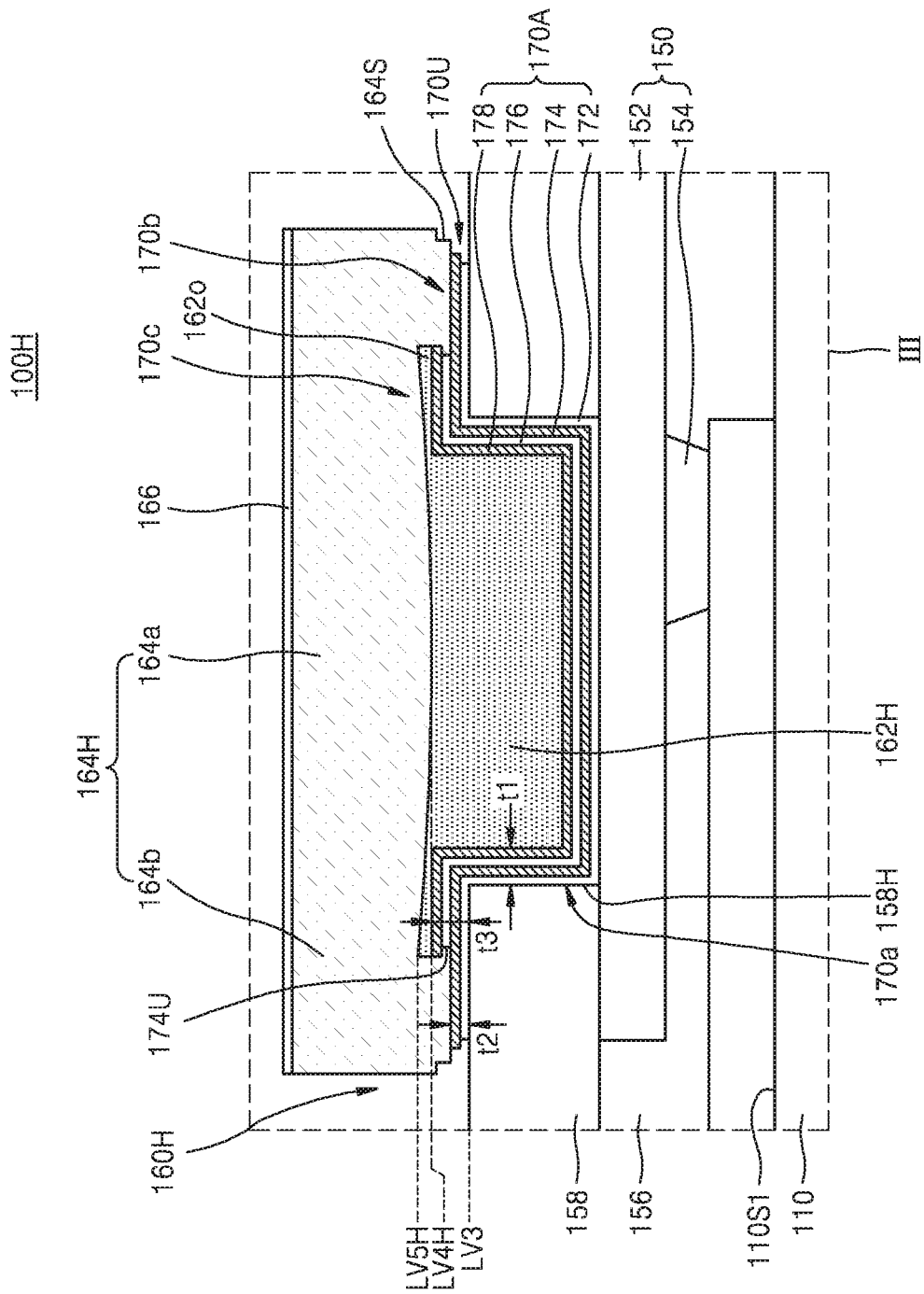

FIG. 11 is a cross-sectional view of a semiconductor device 100H according to some embodiments. In FIG. 11, the same reference numerals are used to denote the same elements as in FIGS. 1 to 10.

Referring to FIG. 11, a pad structure 160H may include a first pad layer 162H including a protrusion 162o extending on a top surface of a second passivation layer 158. The first pad layer 162H may have a concave top profile. A second pad layer 164H may have a convex bottom profile conforming to the top profile of the first pad layer 162H. For example, a top level LV4H of a central portion of the first pad layer 162H may be lower than a top level LV5H of a peripheral portion of the first pad layer 162H relative to the first surface 110S1 of the substrate 110.

Figure 12:
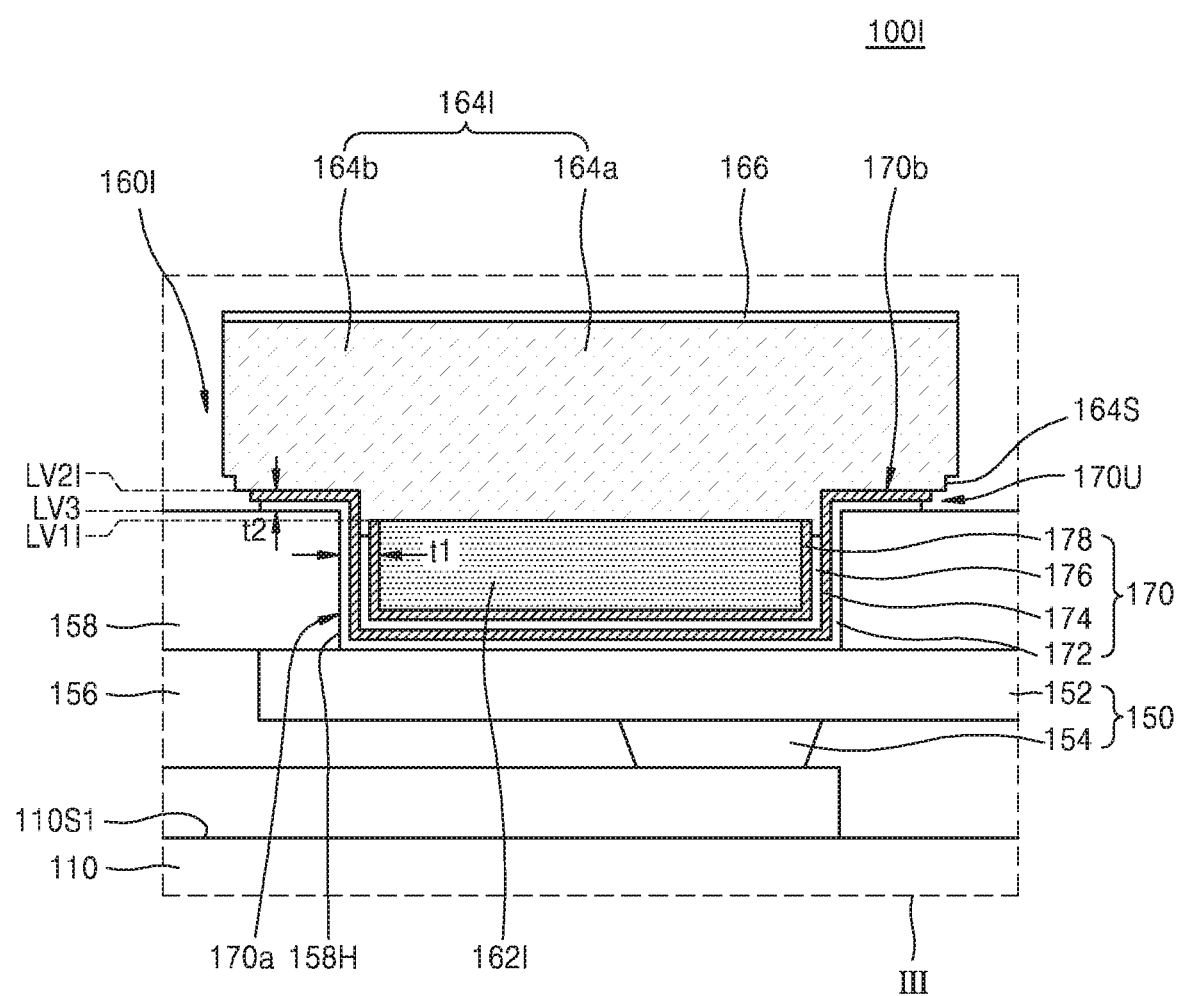

FIG. 12 is a cross-sectional view of a semiconductor device 100I according to some embodiments. In FIG. 12, the same reference numerals are used to denote the same elements as in FIGS. 1 to 11.

Referring to FIG. 12, a pad structure 160I may include a first pad layer 162I having a top surface located at a lower level than the top surface of the second passivation layer 158 and a second pad layer 164I located on the first pad layer 162I. A bottom level LV1I of a first portion 164a of the second pad layer 164I may be lower than a bottom level LV2I of a second portion 164b of the second pad layer 164I on the basis of or relative to a first surface 110S1 of a substrate 110. Also, the bottom level LV1I of the first portion 164a of the second pad layer 164I may be lower than a top level LV3 of the second passivation layer 158 on the basis of or relative to the first surface 110S1 of the substrate 110.

In other words, a top surface of the first pad layer 162I may be at a lower level than the top level LV3 of the second passivation layer 158 on the basis of or relative to the first surface 110S1 of the substrate 110. Also, an uppermost surface of the second seed layer 178 surrounding a sidewall and a bottom surface of the first pad layer 162I may be at a lower level than the top level LV3 of the second passivation layer 158 relative to the first surface 110S1 of the substrate 110.

In a process of forming the pad structure 160I according to some embodiments, after the first pad layer 162I may be formed to fill an opening 158H, the first pad layer 162I and the second seed layer 178 may be etched back until a top surface of the etch stop layer 176 is exposed. After the top surface of the etch stop layer 176 is exposed, the first pad layer 162I and the second seed layer 178 may be excessively etched by as much as a predetermined height. In this case, the first pad layer 162I and the second seed layer 178 may have top surfaces located at a lower level than a top surface of the first seed layer 174 relative to the first surface 110S1 of the substrate 110.

Figure 13:
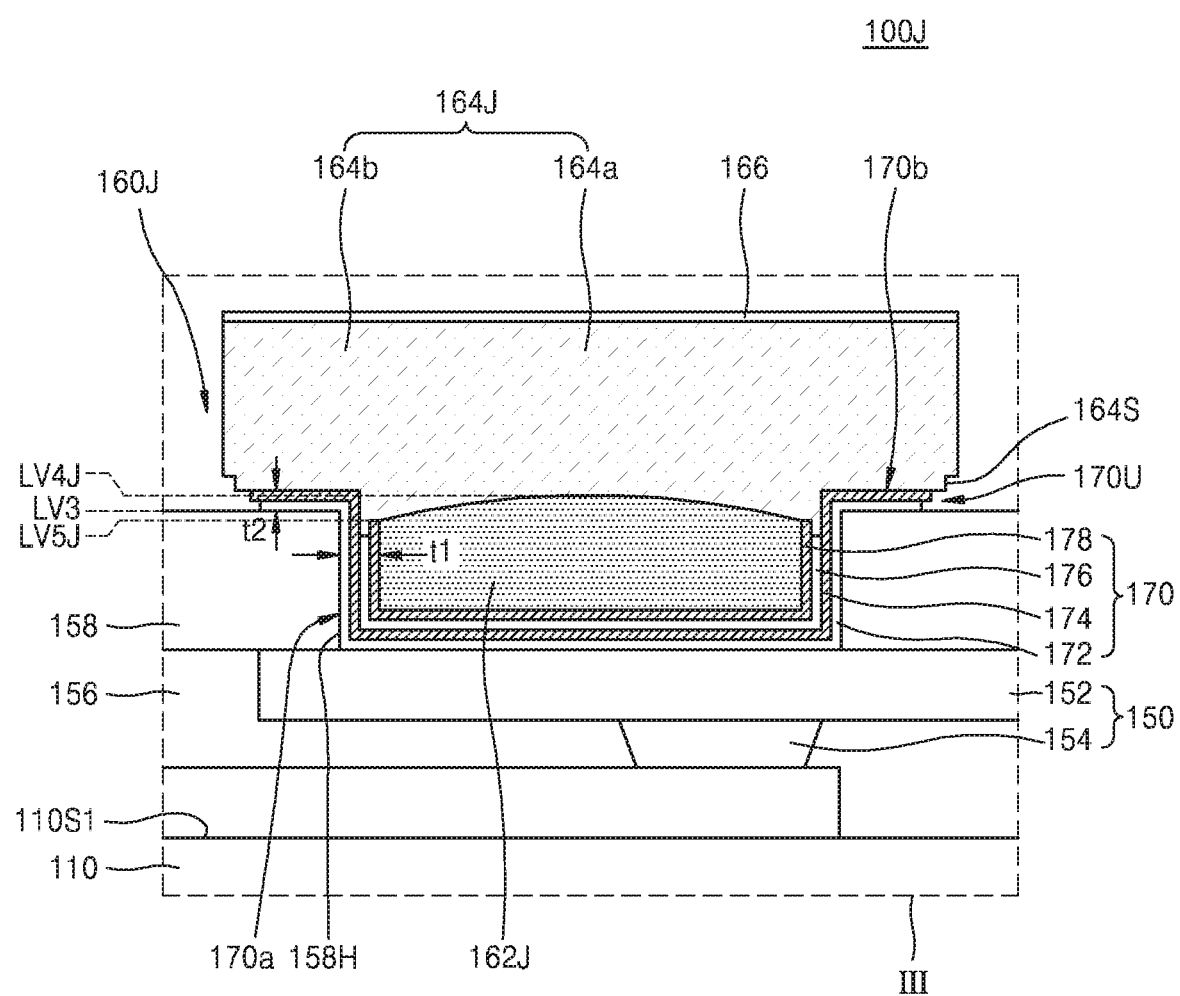

FIG. 13 is a cross-sectional view of a semiconductor device 100J according to some embodiments. In FIG. 13, the same reference numerals are used to denote the same elements as in FIGS. 1 to 12.

Referring to FIG. 13, a pad structure 160J may include a first pad layer 162J having a convex top profile and a second pad layer 164J having a concave bottom profile conforming to the top profile of the first pad layer 162J. For example, a top level LV4J of a central portion of the first pad layer 162J may be higher than a top level LV5J of a peripheral portion of the first pad layer 162J relative to the first surface 110S1 of the substrate 110. FIG. 13 illustrates an example in which the top level LV4J of the central portion of the first pad layer 162J is higher than a top level LV3 of a second passivation layer 158 and the top level LV5J of the peripheral portion of the first pad layer 162J is lower than the top level LV3 of the second passivation layer 158 relative to the first surface 110S1 of the substrate 110. Alternatively, in contrast with FIG. 13, both the top level LV4J of the central portion of the first pad layer 162J and the top level LV5J of the peripheral portion of the first pad layer 162J may be lower than the top level LV3 of the second passivation layer 158 relative to the first surface 110S1 of the substrate 110.

Figure 14:
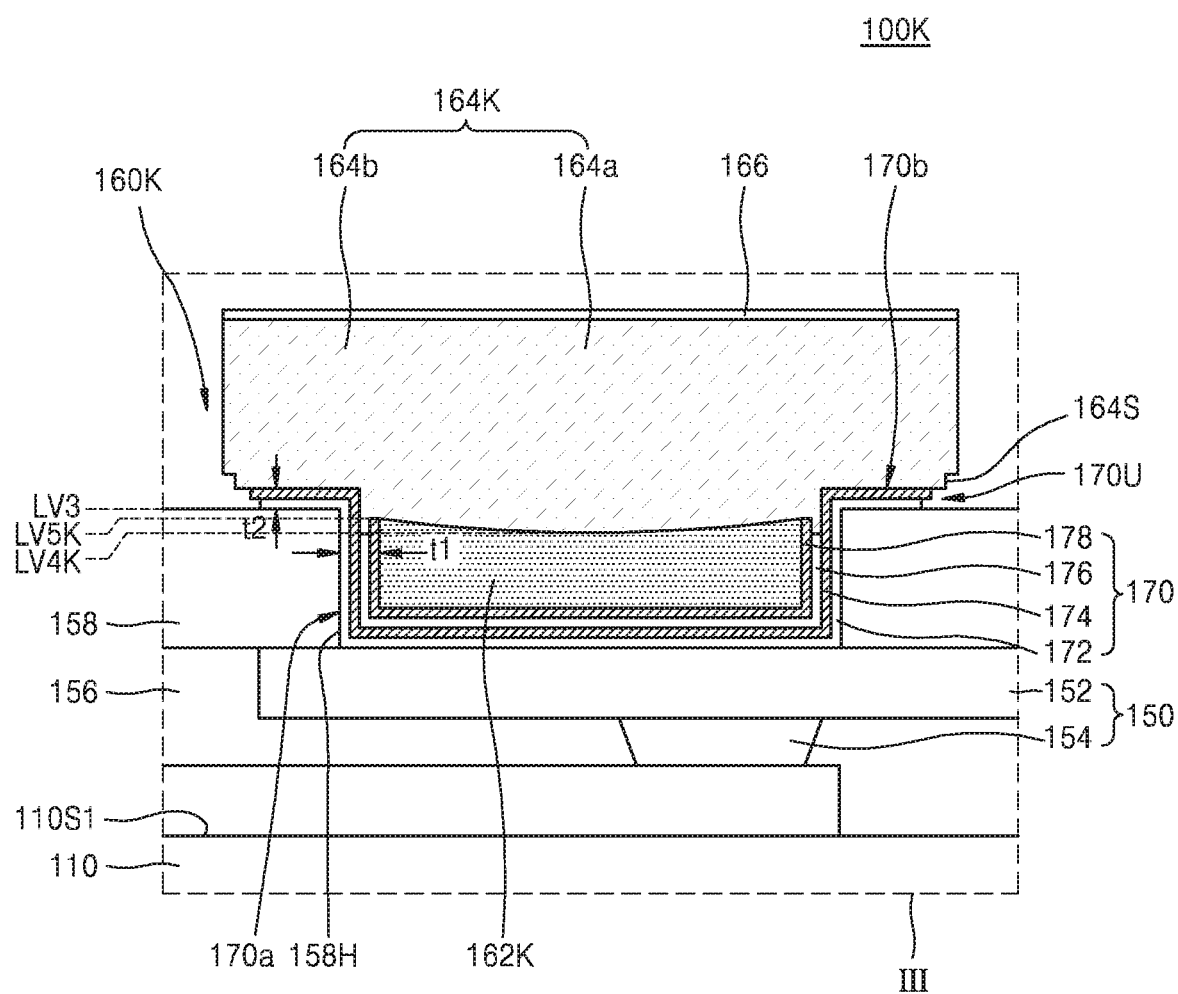

FIG. 14 is a cross-sectional view of a semiconductor device 100K according to some embodiments. In FIG. 14, the same reference numerals are used to denote the same elements as in FIGS. 1 to 13.

Referring to FIG. 14, a pad structure 160K may have a first pad layer 162K having a concave top profile and a second pad layer 164K having a convex bottom profile conforming to the top profile of the first pad layer 162K. For example, a top level LV4K of a central portion of the first pad layer 162K may be lower than a top level LV5K of a peripheral portion of the first pad layer 162K relative to the first surface 110S1 of the substrate 110. Both the top level LV4K of the central portion of the first pad layer 162K and the top level LV5K of the peripheral portion of the first pad layer 162K may be lower than the top level LV3 of the second passivation layer 158 relative to the first surface 110S1 of the substrate 110.

Figure 16:
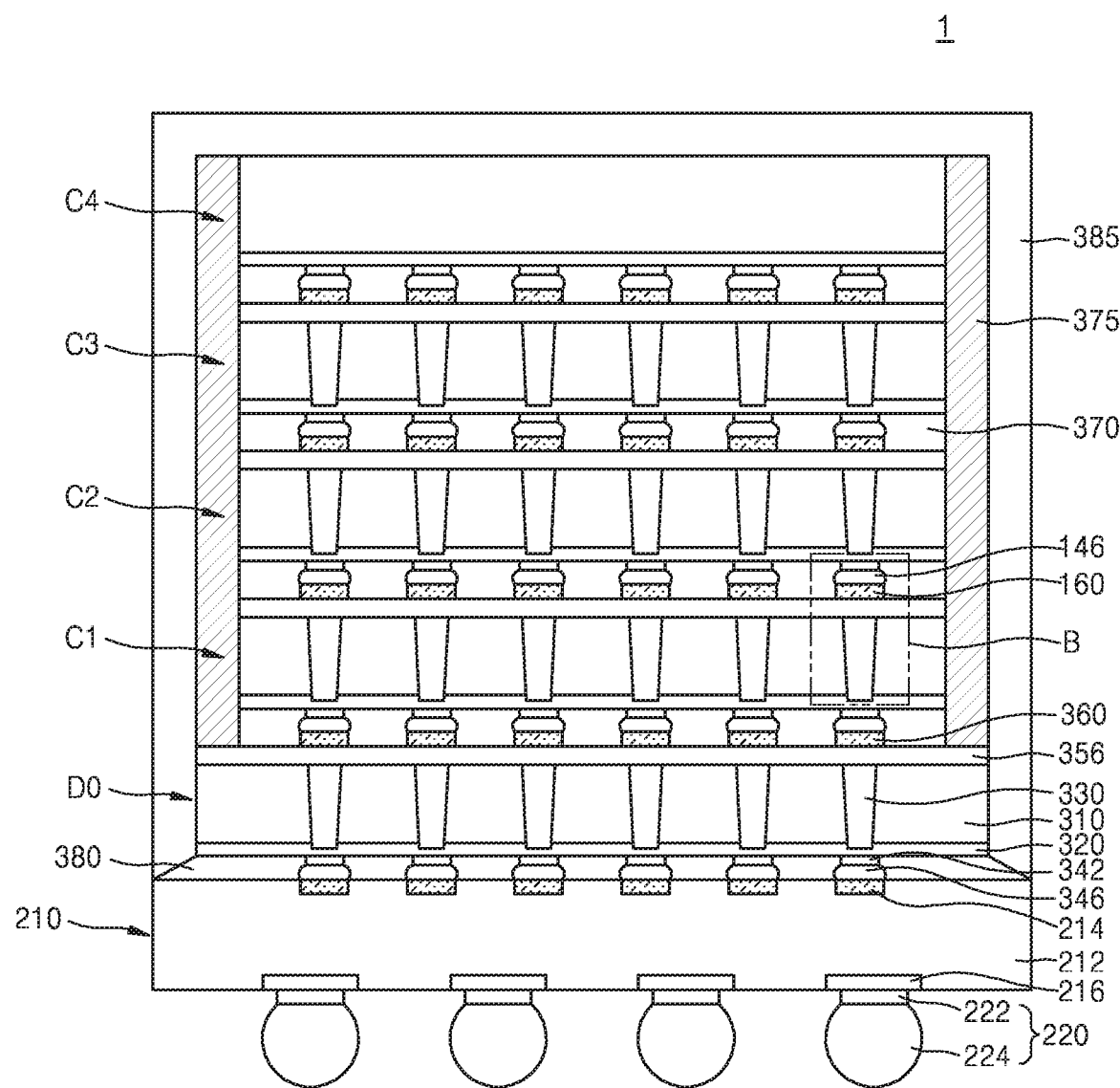
FIG. 16 is a cross-sectional view of a semiconductor package according to some embodiments.
Figure 17:
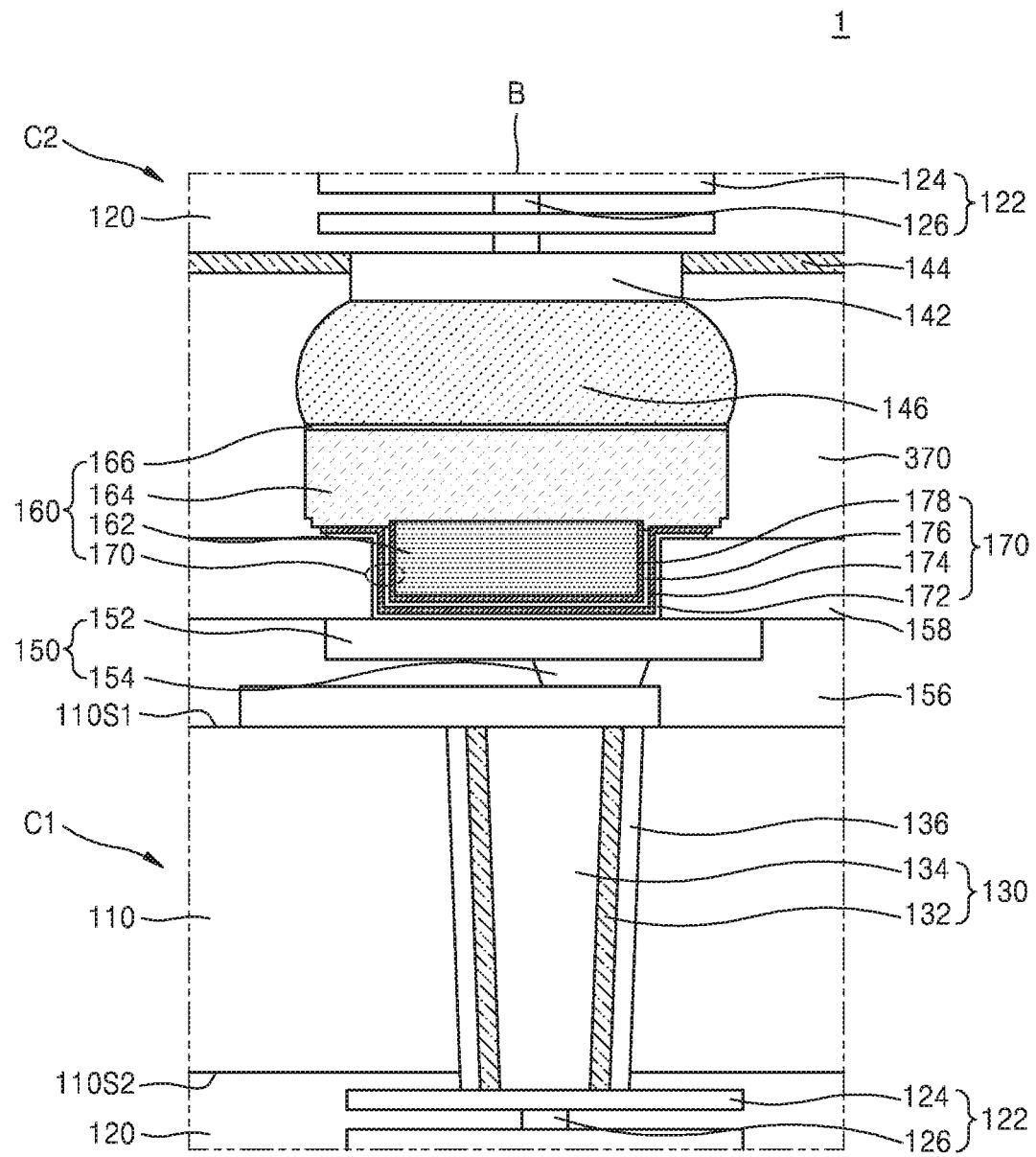
FIG. 17 is an enlarged view of portion B of FIG. 16.

FIG. 16 is a cross-sectional view of a semiconductor package 1 according to some embodiments. FIG. 17 is an enlarged view of a portion B of FIG. 16. In FIGS. 16 and 17, the same reference numerals are used to denote the same elements as in FIGS. 1 to 14.

Referring to FIGS. 16 and 17, the semiconductor package 1 may include a buffer chip DO and first to fourth semiconductor chips C1, C2, C3, and C4, which may be mounted on a package substrate 210. Optionally, the buffer chip DO interposed between the package substrate 210 and the first to fourth semiconductor chips C1, C2, C3, and C4 may be omitted, and the first semiconductor chip C1 may be directly located on and connected to the package substrate 210.

The first to fourth semiconductor chips C1, C2, C3, and C4 may have similar characteristics to those of the semiconductor devices 100, 100A, 100B, 100C, 100D, 100E, 100F, 100G, 100H, 100I, 100J, and/or 100K described with reference to FIGS. 1 to 14.

The first to fourth semiconductor chips C1, C2, C3, and C4 may be, for example, semiconductor memory chips. The semiconductor memory chips may be, for example, volatile semiconductor memory chips, such as dynamic random access memory (DRAM) or static random access memory (SRAM), or non-volatile semiconductor memory chips, such as phase-change RAM (PRAM), magnetoresistive RAM (MRAM), ferroelectric RAM (FeRAM), or resistive RAM (RRAM). In some embodiments, the first to fourth semiconductor chips C1, C2, C3, and C4 may be high-bandwidth memory (HBM) DRAM semiconductor chips.

The buffer chip DO may include a buffer substrate 310, a first interlayer insulating film 320, a buffer TSV 330, a buffer connection pad 342, a buffer connection bump 346, a second interlayer insulating film 356, and a buffer upper connection pad 360. The buffer TSV 330 may penetrate from a top surface to a bottom surface of the buffer substrate 310 and extend into the first interlayer insulating film 320 and/or the second interlayer insulating film 356. A plurality of interconnection structures may be formed in the first interlayer insulating film 320 and electrically connected to the buffer TSV 330.

The buffer chip DO may be a dummy semiconductor chip that does not include an individual device included in each of the first to fourth semiconductor chips C1, C2, C3, and C4. The buffer chip DO may be a buffer die capable of receiving at least one of a control signal, a power supply signal, or a ground signal for operations of the first to fourth semiconductor chips C1, C2, C3, and C4 through the buffer TSV 330 from the outside, receiving a data signal to be stored in the semiconductor chips C1, C2, C3, and C4 from the outside, or providing data stored in the semiconductor chips C1, C2, C3, and C4 to the outside.

An insulating layer 370 may be formed between the first to fourth semiconductor chips C1, C2, C3, and C4 and between the first semiconductor chip C1 and the buffer chip D0. The insulating layer 370 may include an under-fill material, such as an insulating polymer, an epoxy resin, and/or a non-conductive film (NCF). A first molding layer 375 may surround side surfaces of the first to fourth semiconductor chips C1, C2, C3, and C4 and a side surface of the insulating layer 370. The first molding layer 375 may include an epoxy mold compound (EMC).

The package substrate 210 may be, for example, a printed circuit board (PCB), a ceramic substrate, or an interposer. When the package substrate 210 is a PCB, the package substrate 210 may include a substrate base 212 and top pads 214 and bottom pads 216 formed on a top surface and a bottom surface of the substrate base 212, respectively. The top pads 214 and the bottom pads 216 may be respectively exposed by solder resist layers covering the top surface and the bottom surface of the substrate base 212. The substrate base 212 may include at least one of a phenol resin, an epoxy resin, or polyimide. For example, the substrate base 212 may include at least one of FR4, tetrafunctional epoxy, polyphenylene ether), epoxy/polyphenylene oxide, bismaleimide triazine (BT), Thermount®, cyanate ester, polyimide, or a liquid crystal polymer. The top pads 214 and the bottom pads 216 may include copper, nickel, stainless steel, and/or beryllium copper. An internal connection may be formed in the substrate base 212 to electrically connect the top pads 214 and the bottom pads 216. The top pads 214 and the bottom pads 216 may be portions of circuit interconnections, which are exposed by the solder resist layers, when the circuit interconnections are formed by coating the top surface and the bottom surface of the substrate base 212 with copper (Cu) foil and patterning the copper foil.

When the package substrate 210 is an interposer, the package substrate 210 may include a substrate base 212 including a semiconductor material and top pads 214 and bottom pads 216 formed on a top surface and a bottom surface of the substrate base 212, respectively. The substrate base 212 may include, for example, a silicon wafer. Also, an internal interconnection may be formed on a top surface or a bottom surface of the substrate base 212 or inside the substrate base 212. Also, through vias configured to electrically connect the top pads and the bottom pads may be formed in the substrate base 212.

External connection terminals 220 may be adhered to the bottom surface of the package substrate 210. For example, the external connection terminals 220 may be adhered to the bottom pads 216. The external connection terminals 220 may be, for example, solder balls or bumps. The external connection terminals 220 may electrically connect the semiconductor package 1 with an external apparatus. For example, the external connection terminals 220 may include a lower conductive layer 222 located on the bottom pads 216 in the bottom surface of the package substrate 210 and solder balls 224 located on the lower conductive layer 222. The external connection terminals 220 may further include external connection pillars interposed between the lower conductive layer 222 and the solder balls 224. The external connection pillars may include, for example, copper (Cu).

An under-fill material layer 380 may be formed between the package substrate 210 and the buffer chip DO. The under-fill material layer 380 may be interposed between the package substrate 210 and the buffer chip DO and surround a side surface of the buffer connection bump 346. The under-fill material layer 380 may include, for example, an epoxy resin. In some embodiments, the under-fill material layer 380 may be a portion of a second molding layer 385 formed by using a molded under-fill (MUF) method.

The second molding layer 385 may be formed on the package substrate 210 to partially or wholly surround the buffer chip DO and the first to fourth semiconductor chips C1, C2, C3, and C4. The second molding layer 385 may surround the first molding layer 375 but may not be in direct contact with side surfaces of the first to fourth semiconductor chips C1, C2, C3, and C4. The second molding layer 385 may include, for example, EMC.

In the semiconductor package 1 according to some embodiments, each of the first to fourth semiconductor chips C1, C2, C3, and C4 may include the pad structure 160 described with reference to FIGS. 1 to 3. For example, in a process of bonding the second semiconductor chip C2 to the first semiconductor chip C1, after the connection bump 146 of the second semiconductor chip C2 is located on the pad structure 160 of the first semiconductor chip C1, the pad structure 160 of the first semiconductor chip C1 may be bonded to the connection bump 146 of the second semiconductor chip C2 by using a thermal compression bonding process or a reflow process. Since the entire area of the pad structure 160 has a planar top surface, the trapping of an organic material (e.g., a portion of the insulating layer 370) into the connection bump 146 may be reduced or prevented during the bonding process. Also, since the first pad layer (refer to 162 in FIG. 3) is not exposed outside the pad structure 160, generation of an IMC due to a contact of a solder material included in the connection bump 146 with the first pad layer 162 may be reduced or prevented. Accordingly, the semiconductor package 1 may have high reliability.

Although FIG. 17 illustrates an example of the pad structure 160 described with reference to FIGS. 1 to 3, one or more of the first to fourth semiconductor chips C1, C2, C3, and C4 may include the pad structures 160A, 160B, 160C, 160D, 160E, 160F, 160G, 160H, 160I, 160J, or 160K described with reference to FIGS. 4 to 14.

FIGS. 18 to 25 are cross-sectional views of a method of manufacturing a semiconductor device 100F according to some embodiments.

Figure 18:
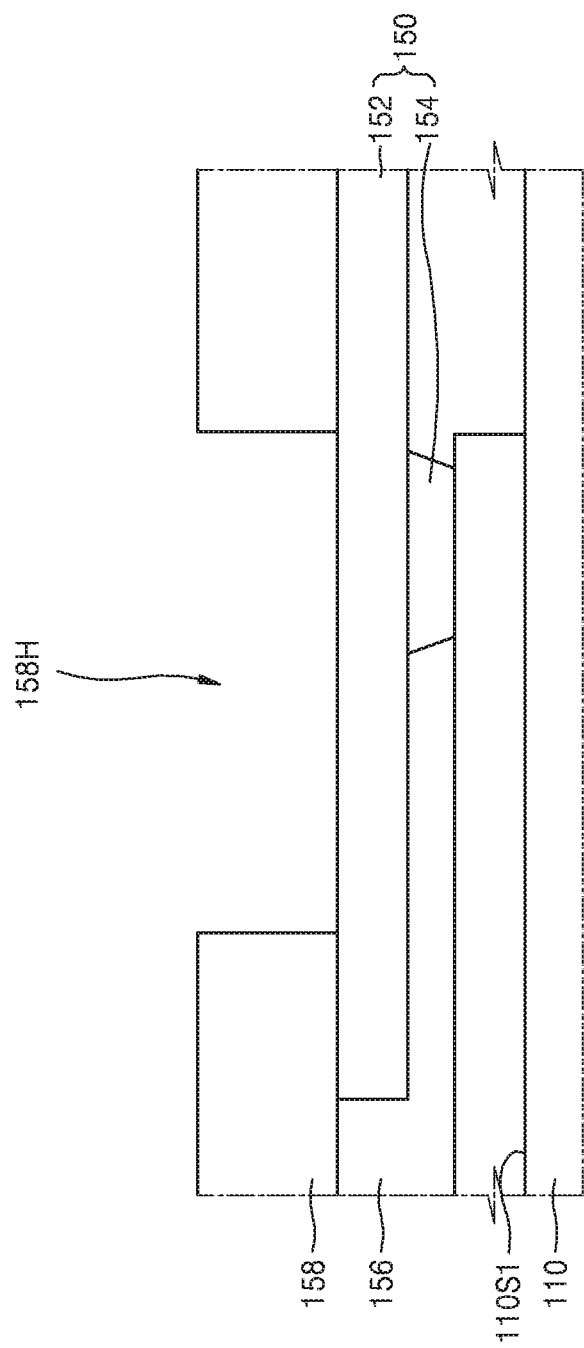
FIGS. 18, 19, 20, 21, 22, 23, 24, and 25 are cross-sectional views of a method of manufacturing a semiconductor device, according to some embodiments.

Referring to FIG. 18, a substrate 110 including a redistribution structure 150 and a redistribution insulating layer 156 may be prepared. As described with reference to FIGS. 1 to 3, the redistribution structure 150 may have a multi-layered structure including a plurality of redistribution lines 152 and a plurality of redistribution vias 154, and the redistribution insulating layer 156 may surround the redistribution structure 150.

Thereafter, an insulating layer may be formed on the redistribution insulating layer 156 and patterned by using a photoresist pattern to form a second passivation layer 158 having an opening 158H. The opening 158H may expose portions of top surfaces of the redistribution lines 152.

In some embodiments, the second passivation layer 158 may be formed by using a spin coating process, a spray process, or a chemical vapor deposition (CVD) process.

Figure 19:
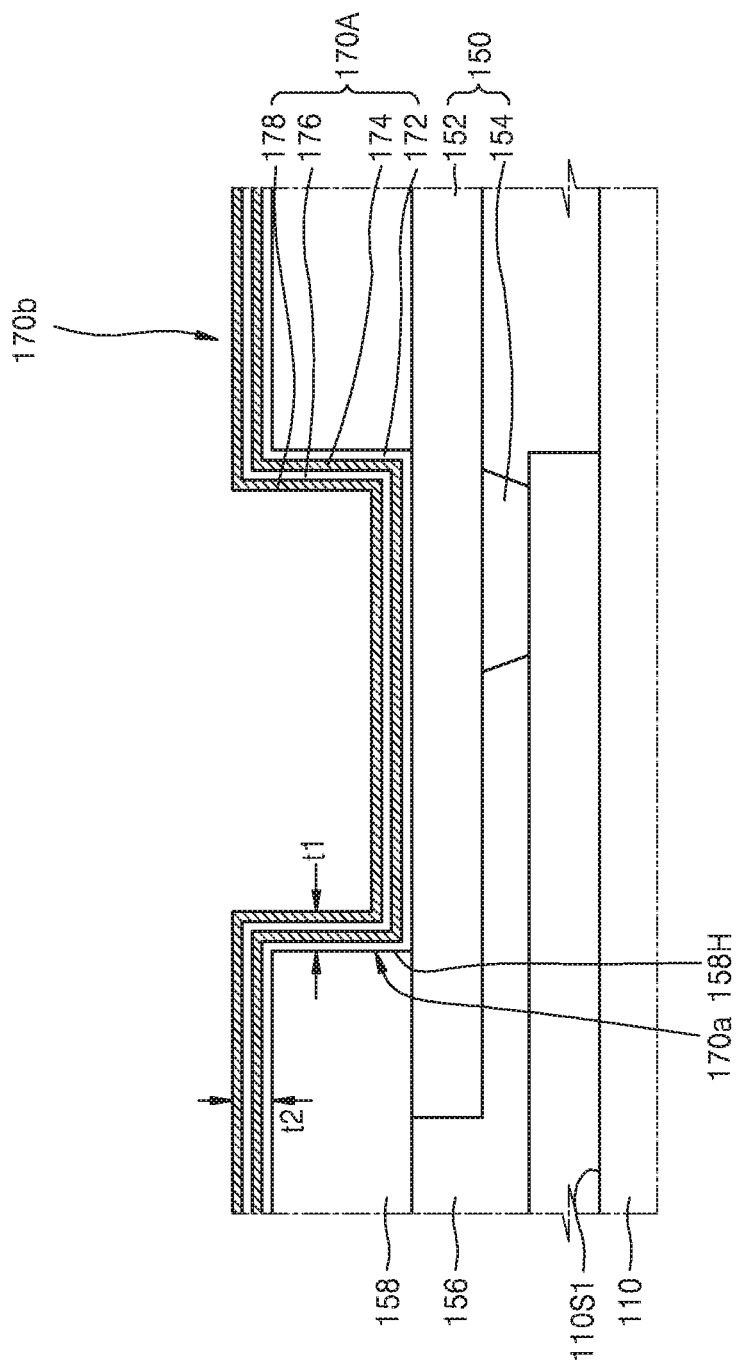

Referring to FIG. 19, a conductive barrier layer 172, a first seed layer 174, an etch stop layer 176, and a second seed layer 178 may be sequentially formed on the second passivation layer 158 to form a lower conductive layer 170A. The lower conductive layer 170A may be conformally formed on a sidewall of an opening 158H of the second passivation layer 158 and the top surfaces of the redistribution lines 152 exposed on a bottom portion of the opening 158H. In some embodiments, the conductive barrier layer 172, the first seed layer 174, the etch stop layer 176, and the second seed layer 178 may be formed by using a sputtering process or a CVD process. Respective thicknesses and materials of the conductive barrier layer 172, the first seed layer 174, the etch stop layer 176, and the second seed layer 178 may be similar to those described with reference to FIGS. 1 to 3.

Here, a portion of the lower conductive layer 170A, which is formed on the sidewall of the opening 158H, may be referred to as a first portion 170a of the lower conductive layer 170A, and a portion of the lower conductive layer 170A, which is formed on a top surface of the second passivation layer 158, may be referred to as a second portion 170b of the lower conductive layer 170A. A thickness t1 of the first portion 170a may be substantially equal or similar to a thickness t2 of the second portion 170b.

Figure 20:
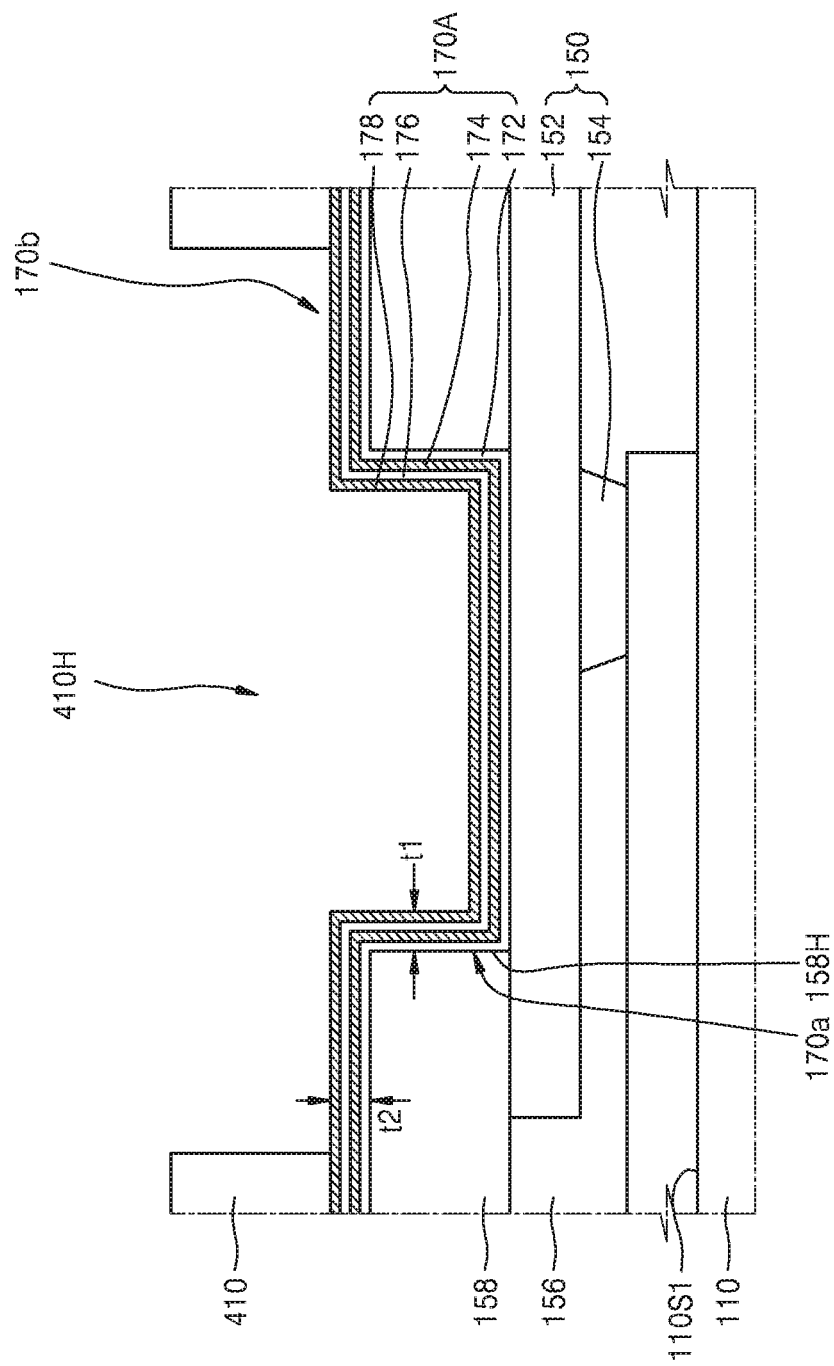

Referring to FIG. 20, an insulating layer may be formed on the lower conductive layer 170A and patterned by using a photolithography process to form a mold layer 410 having a pad space 410H. In some embodiments, the mold layer 410 may include a photoresist material, a photosensitive polyimide, an ultraviolet (UV)-curing polymer, an epoxy resin, silicon oxide, and/or silicon nitride.

The pad space 410H may be in communication with to the opening 158H of the second passivation layer 158. For example, the pad space 410H may have a greater width than the opening 158H. In some embodiments, the entire first portion 170a of the lower conductive layer 170A may be exposed by the pad space 410H, and a portion of the second portion 170b of the lower conductive layer 170A may be exposed in a peripheral portion of the pad space 410H.

Figure 21:
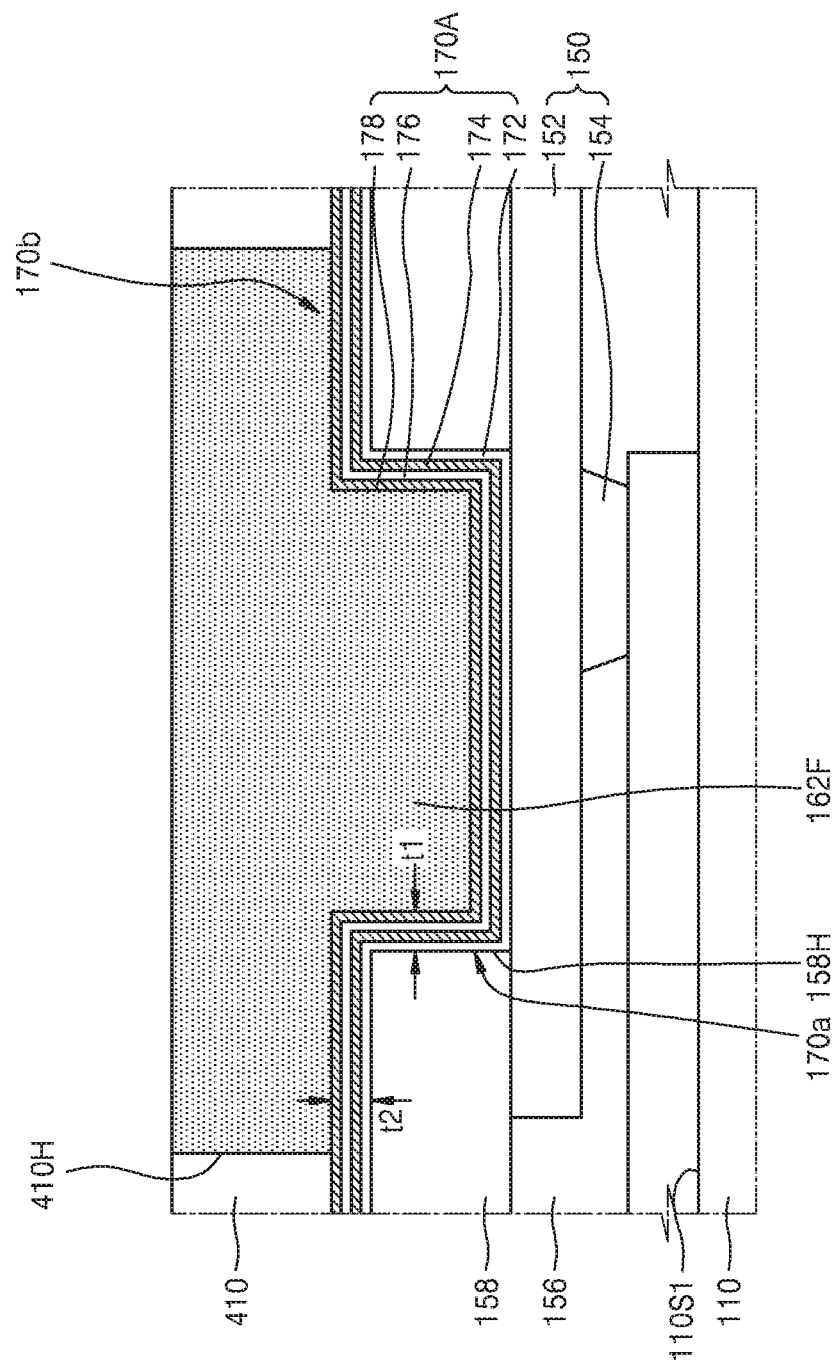

Referring to FIG. 21, a first pad layer 162F may be formed on the second seed layer 178, which is exposed in the pad space 410H and on an inner wall of the opening 158H, by using an electroplating process or an electroless plating process. For example, when the first pad layer 162F includes copper (Cu), even if a bottom surface of the first pad layer 162F has a relatively high difference in height, the pad space 410H and the opening 158H may be filled with the first pad layer 162F so that the first pad layer 162F may have a planar top surface over substantially the entire area of the pad space 410H.

Figure 22:
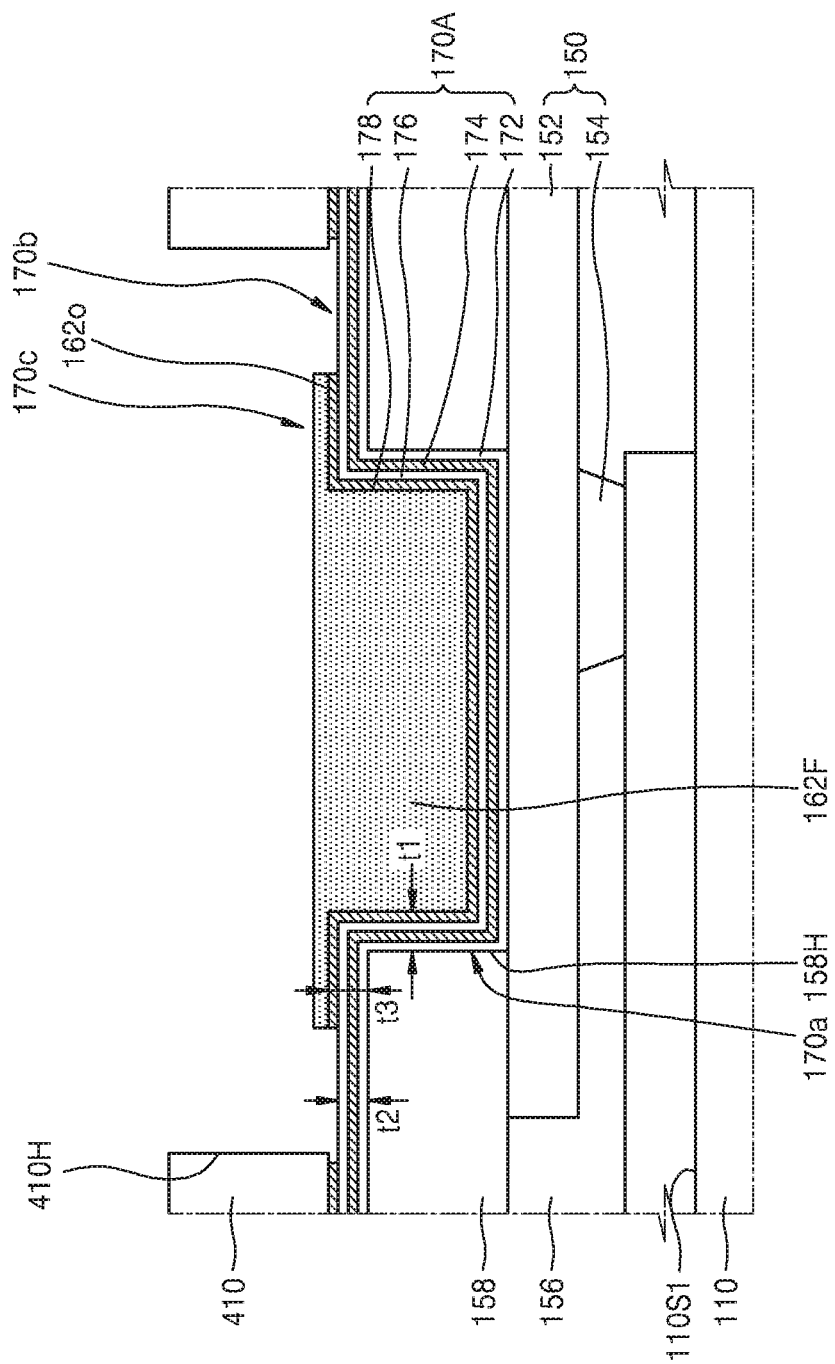

Referring to FIG. 22, an upper portion of the first pad layer 162F may be removed by using an etchback process until a top surface of an etch stop layer 176 is exposed. Due to the etchback process, the second portion 170b of the lower conductive layer 170A (i.e., a portion of the second seed layer 178 formed on a top surface of the second passivation layer 158) may be removed. Meanwhile, a sidewall of the pad space 410H may be exposed again by using the etchback process.

In addition, since the second seed layer 178 is removed from the peripheral portion of the pad space 410H, the thickness t2 of the second portion 170b of the lower conductive layer 170A may be less than the thickness t1 of the first portion 170a. The first pad layer 162F may have a top surface located at a higher level than the top level LV3 (refer to FIG. 3) of the second passivation layer 158 relative to the first surface 110S1 of the substrate 110, and the first pad layer 162F may fill substantially the entire remaining portion of the opening 158H.

In some embodiments, the first pad layer 162F may include a protrusion 162o located on the top surface of the second passivation layer 158. Here, a portion of the lower conductive layer 170A located under the protrusion 162o may be referred to as a third portion 170c.

In other embodiments, in contrast with FIG. 22, the etchback process may be performed until a top surface of the first pad layer 162, a top surface of the second seed layer 178, and a top surface of the etch stop layer 176 exposed in the pad space 410H become coplanar with one another. In this case, the semiconductor device 100 described with reference to FIGS. 1 to 3 may be formed.

Figure 23:
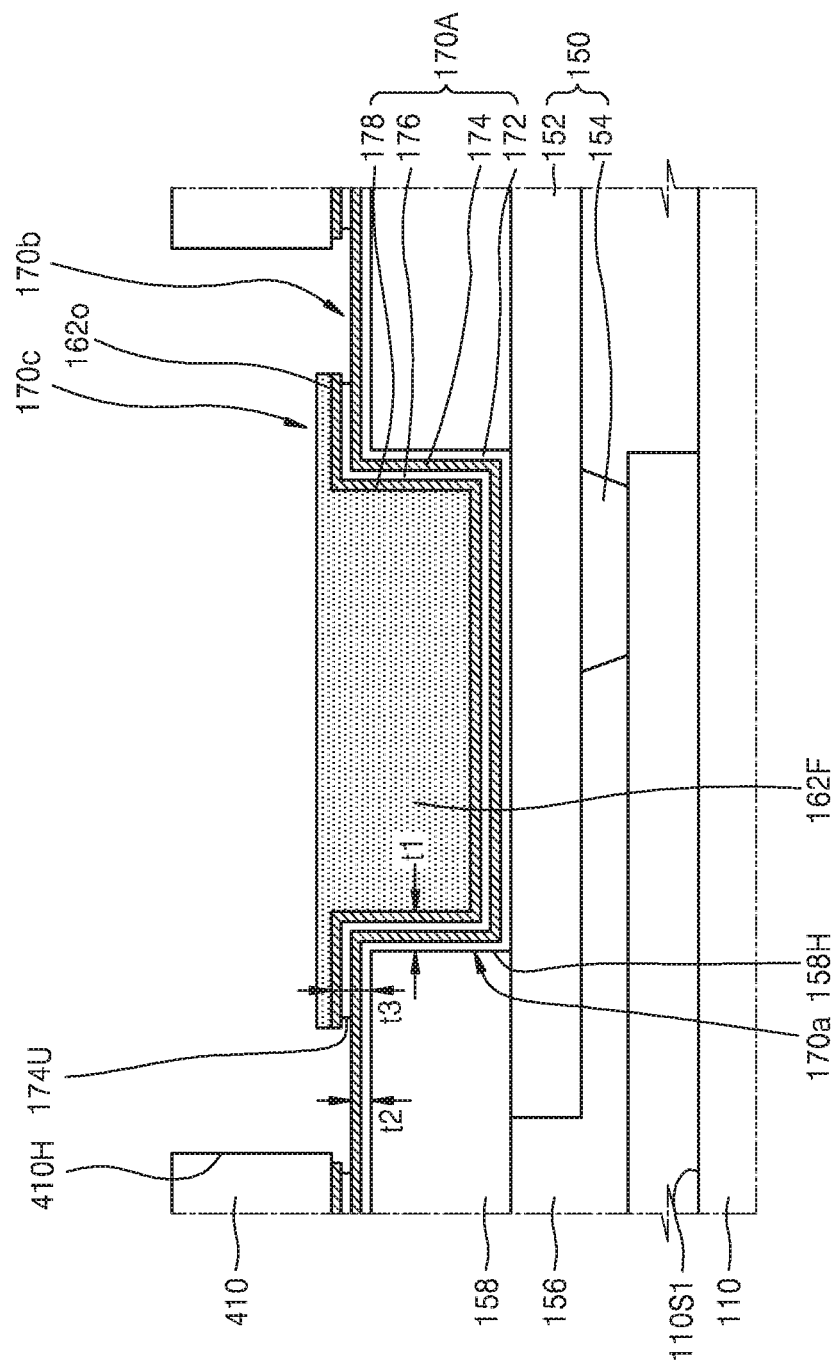

Referring to FIG. 23, the etch stop layer 176 exposed in the pad space 410H may be removed. According to some embodiments, the process of removing the etch stop layer 176 may be performed by using etching conditions having etch selectivities with respect to the first pad layer 162F and the first and second seed layers 174 and 178. For example, the removal process may be a wet etching process or a dry etching process.

As a result of the removal process, only a portion of the etch stop layer 176 located in the second portion 170b of the lower conductive layer 170A may be removed, and a top surface of a portion of the first seed layer 174 located on the top surface of the second passivation layer 158 may be exposed. Also, since the portion of the etch stop layer 176 is removed from the peripheral portion of the pad space 410H, the thickness t2 of the second portion 170b of the lower conductive layer 170A may be less than the thickness t1 of the first portion 170a or a thickness t3 of the third portion 170c of the lower conductive layer 170A.

Figure 24:
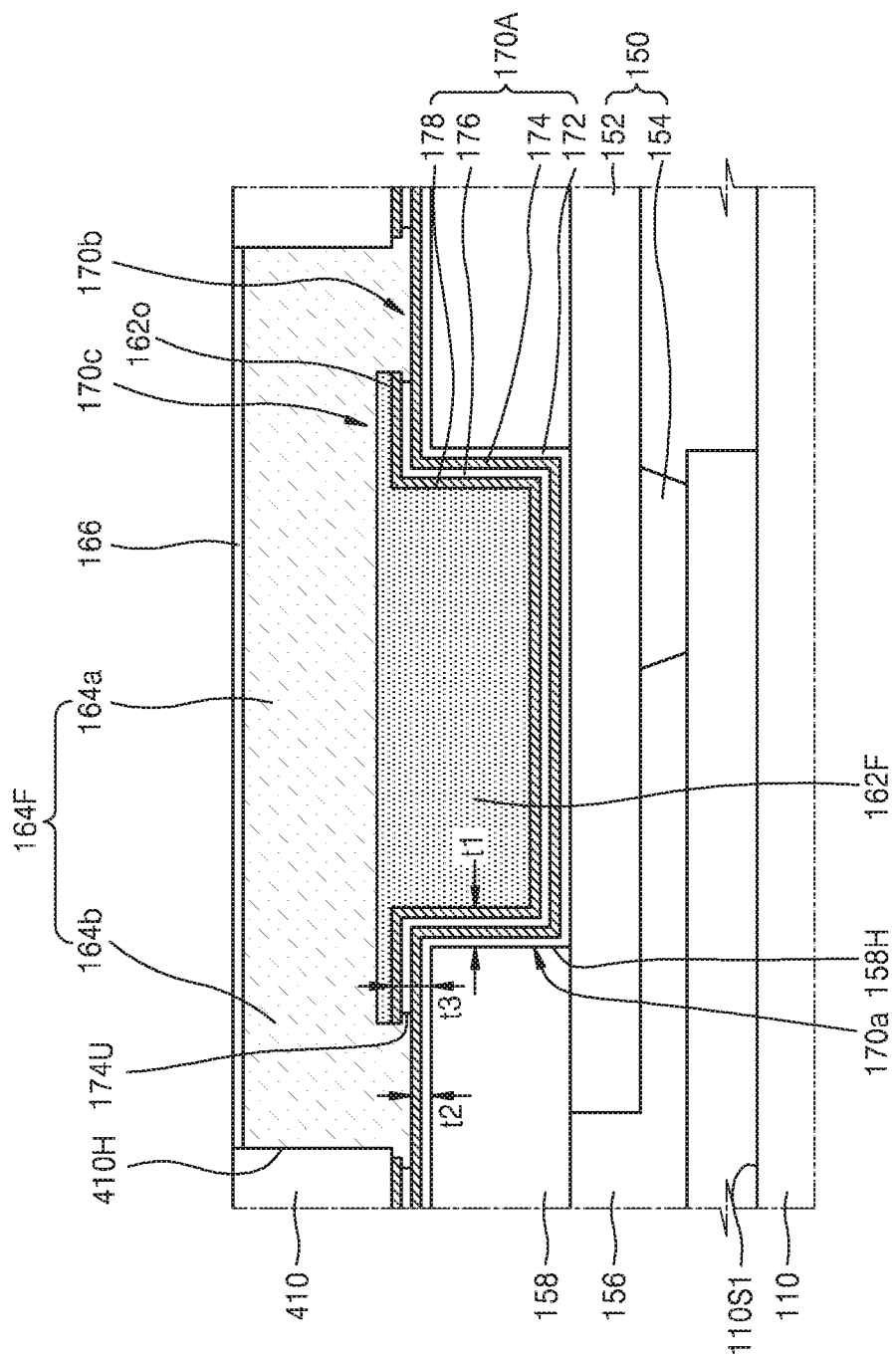

Referring to FIG. 24, a second pad layer 164F may be formed on the first seed layer 174 and the first pad layer 162, which are exposed on a bottom portion of the pad space 410H, by using an electroplating process or an electroless plating process. Since there is a relatively small level difference between the first seed layer 174 and the first pad layer 162F, which are exposed on the bottom portion of the pad space 410H, even if the second pad layer 164F includes, for example, nickel (Ni), the pad space 410H may be filled with the second pad layer 164F so that the second pad layer 164F may have a planar top surface over substantially the entire area of the pad space 410H.

Here, a portion of the second pad layer 164, which has a bottom surface in contact with the top surface of the first pad layer 162F, may be referred to as a first portion 164a of the second pad layer 164F, while a portion of the second pad layer 164F, which has a bottom surface in contact with the top surface of the first seed layer 174, may be referred to as a second portion 164b of the second pad layer 164F. According to some embodiments, since the second pad layer 164F is formed on the bottom portion of the pad space 410H by using the first seed layer 174 and the first pad layer 162F as a seed material, the second pad layer 164F may be formed to a uniform height with a planar top surface over the entire area of the pad space 410H.

Thereafter, a capping layer 166 may be formed on the second pad layer 164F by using an electroplating process or an electroless plating process.

Figure 25:
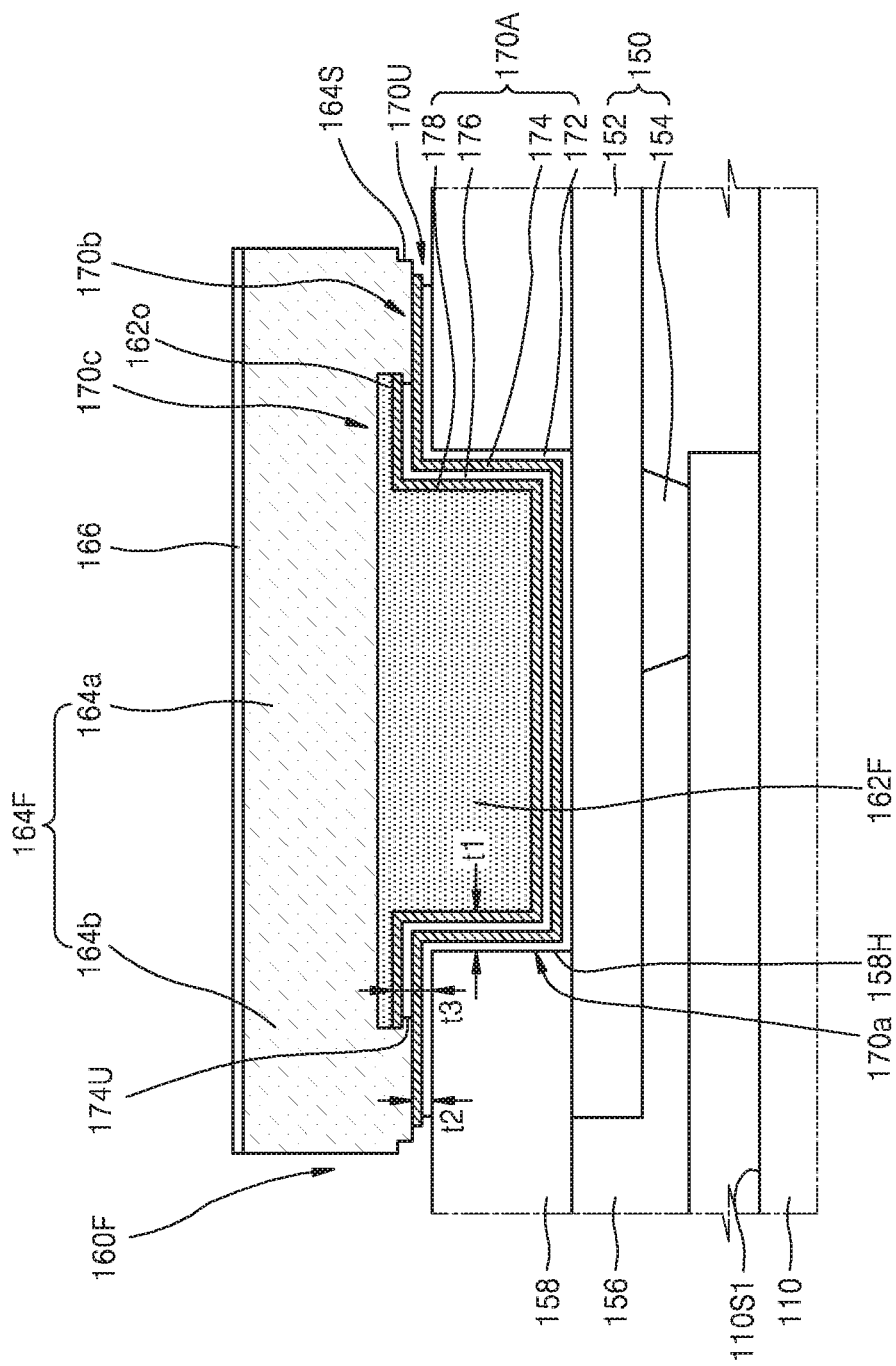

Referring to FIG. 25, the mold layer (refer to 410 in FIG. 24) may be removed. Thereafter, the second seed layer 178 and the etch stop layer 176 located on the top surface of the second passivation layer 158 may be sequentially removed.

Referring to FIGS. 9 and 25, the first seed layer 174 and the conductive barrier layer 172 formed on the top surface of the second passivation layer 158 may be sequentially removed. In the process of removing the first seed layer 174 and the conductive barrier layer 172, portions of the first seed layer 174 and the conductive barrier layer 172 located under the second pad layer 164F may also be removed. Thus, an undercut region 170U may be defined at a position from which the first seed layer 174 and the conductive barrier layer 172 are removed, between the peripheral portion of the second pad layer 164F (e.g., the second portion 164b of the second pad layer 164F) and the second passivation layer 158. A shape and size of the undercut region 170U are illustrated in FIG. 3 for brevity, and the inventive concepts are not limited to those shown in FIG. 9. According to other embodiments, the first seed layer 174 and the conductive barrier layer 172 may be removed by using, for example, a directional etching process. In this case, the first seed layer 174 and the conductive barrier layer 172 between the peripheral portion of the second pad layer 164F and the second passivation layer 158 may be hardly removed. Thus, the undercut region 170U may not be formed or may have a substantially vertical sidewall profile.

The manufacturing of the semiconductor device 100F may be completed by using the above-described method.

In the method of manufacturing the semiconductor device 100F according to some embodiments, the first pad layer 162F may be etched back until the top surface of the etch stop layer 176 is exposed, and the exposed portion of the etch stop layer 176 may be removed. Thereafter, the second pad layer 164F may be formed by using the first pad layer 162F and the exposed first seed layer 174 as a seed layer. Accordingly, a top surface of the entire area of the second pad layer 164F may be substantially planar. Thus, the trapping of an organic material into a solder layer may be reduced or prevented during a process of bonding the semiconductor device 100F to another semiconductor device. Also, since the first pad layer 162F is not exposed outside the pad structure 160F, generation of an IMC due to a contact of the solder layer with the first pad layer 162F may be reduced or prevented. Accordingly, the semiconductor device 100F may have high reliability.

As used herein, the singular forms "a," "an" and "the" are intended to include the plural forms as well, unless the context clearly indicates otherwise. The term "and/or" includes any and all combinations of one or more of the associated listed items.

While the inventive concepts have been particularly shown and described with reference to embodiments thereof, it will be understood that various changes in form and details may be made therein without departing from the spirit and scope of the following claims.

What is claimed is:

1. A method of manufacturing a semiconductor device, the method comprising:
    forming, on a substrate, a passivation layer comprising an opening therein, the opening exposing at least a portion of a conductive component;
    forming a lower conductive layer on an inner sidewall of the opening and a top surface of the passivation layer by sequentially forming a conductive barrier layer, a first seed layer, an etch stop layer, and a second seed layer;
    forming a mold layer on the lower conductive layer, the mold layer comprising a pad space communicated with the opening;

forming, on the lower conductive layer, a first pad layer in the opening and the pad space by using the second seed layer as a seed material, and etching back an upper portion of the first pad layer until a top surface of the etch stop layer is exposed, such that the first pad layer fills only the opening; and forming, on the first pad layer, a second pad layer in the pad space.

2. The method of claim 1, wherein the etching back of the upper portion of the first pad layer comprises etching back the upper portion of the first pad layer until a top surface of the first pad layer is at a same level as the top surface of the etch stop layer relative to the substrate.

3. The method of claim 1, wherein the etching back of the upper portion of the first pad layer comprises etching back the upper portion of the first pad layer until a top surface of the first pad layer is at a lower level than the top surface of the etch stop layer relative to the substrate.

4. The method of claim 1, wherein the etching back of the upper portion of the first pad layer comprises etching back the upper portion of the first pad layer until the top surface of the etch stop layer is exposed in a peripheral portion of the pad space and a protrusion of the first pad layer remains on the top surface of the passivation layer around the opening.

5. The method of claim 1, further comprising, after the forming of the first pad layer, removing the etch stop layer exposed in the pad space until a top surface of the first seed layer is exposed in the pad space.

6. The method of claim 5, wherein the forming of the second pad layer comprises forming the second pad layer on the first pad layer and the first seed layer so as to fill a remaining portion of the pad space.

7. The method of claim 6, wherein the forming of the second pad layer comprises forming the second pad layer so as to fill the remaining portion of the pad space by using the first pad layer located in a central portion of the pad space and the first seed layer located in a peripheral portion of the pad space as a seed material.

8. The method of claim 1, further comprising:
after the forming of the second pad layer, removing the mold layer; and
forming an undercut region under a peripheral portion of the second pad layer by removing a portion of the lower conductive layer which is not covered by the second pad layer.

9. The method of claim 8, wherein in the forming of the undercut region, a portion of the lower conductive layer remains on the passivation layer and under the second pad layer.

10. A method of manufacturing a semiconductor device, the method comprising:
forming, on a substrate, a passivation layer comprising an opening therein, the opening exposing at least a portion of a conductive component;
forming a lower conductive layer on an inner sidewall of the opening and a top surface of the passivation layer, the lower conductive layer including a conductive barrier layer, a first seed layer, an etch stop layer, and a second seed layer;
forming a mold layer on the lower conductive layer, the mold layer comprising a pad space communicated with the opening;
forming, on the lower conductive layer, a first pad layer to fill the opening;

removing a portion of the second seed layer and a portion of the etch stop layer disposed on the passivation layer such that a top surface of the first seed layer is exposed; and forming, on the first pad layer and the top surface of the first seed layer, a second pad layer in the pad space.

11. The method of claim 10, wherein the forming of the first pad layer comprises:
forming the first pad layer in the opening and the pad space by using the second seed layer as a seed material; and
etching back an upper portion of the first pad layer until a top surface of the etch stop layer is exposed, such that the first pad layer fills only the opening.

12. The method of claim 10, further comprising:
after the forming of the second pad layer, removing the mold layer; and
forming an undercut region under a peripheral portion of the second pad layer by removing a portion of the lower conductive layer which is not covered by the second pad layer.

13. The method of claim 12, wherein in the forming of the undercut region, a portion of the lower conductive layer remains on the passivation layer and under the second pad layer.

14. The method of claim 10, wherein the forming of the second pad layer comprises forming the second pad layer so as to fill a remaining portion of the pad space by using the first pad layer located in a central portion of the pad space and the first seed layer located in a peripheral portion of the pad space as a seed material.

15. A method of manufacturing a semiconductor device, the method comprising:
forming, on a substrate, a passivation layer comprising an opening therein, the opening exposing at least a portion of a conductive component;
forming a lower conductive layer on an inner sidewall of the opening and a top surface of the passivation layer, the lower conductive layer including a conductive barrier layer, a first seed layer, an etch stop layer, and a second seed layer;
forming a mold layer on the lower conductive layer, the mold layer comprising a pad space communicated with the opening;
forming, on the lower conductive layer, a first pad layer to fill the opening;
forming, on the first pad layer and a top surface of the first seed layer, a second pad layer filling the pad space;
removing the mold layer; and
forming an undercut region under a peripheral portion of the second pad layer by removing a portion of the lower conductive layer which is not covered by the second pad layer.

16. The method of claim 15, wherein in the forming of the undercut region, a portion of the lower conductive layer remains on the passivation layer and under the second pad layer.

17. The method of claim 15, wherein the forming of the first pad layer comprises:
forming the first pad layer in the opening and the pad space by using the second seed layer as a seed material;
etching back an upper portion of the first pad layer such that the first pad layer fills only the opening; and
removing a portion of the second seed layer and a portion of the etch stop layer, the portion of the second seed layer being disposed on the passivation layer, and the portion of the etch stop layer being disposed on the passivation layer.

18. The method of claim 15, wherein the forming of the second pad layer comprises forming the second pad layer so as to fill a remaining portion of the pad space by using the first pad layer located in a central portion of the pad space and the first seed layer located in a peripheral portion of the pad space as a seed material.

19. The method of claim 15, wherein in the forming of the second pad layer, the first seed layer is not disposed in a peripheral portion of the pad space.

20. The method of claim 1, wherein the forming of the second pad layer comprises:
   forming the second pad layer in the pad space and laterally extending beyond the first pad layer.

* * * * *